US006806564B2

(12) United States Patent
Terui et al.

(10) Patent No.: US 6,806,564 B2
(45) Date of Patent: Oct. 19, 2004

(54) SEMICONDUCTOR APPARATUS WITH DECOUPLING CAPACITOR

(75) Inventors: Makoto Terui, Tokyo (JP); Noritaka Anzai, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/757,467

(22) Filed: Jan. 15, 2004

(65) Prior Publication Data

US 2004/0145041 A1 Jul. 29, 2004

Related U.S. Application Data

(62) Division of application No. 10/211,365, filed on Aug. 5, 2002, now Pat. No. 6,707,146, which is a division of application No. 09/827,246, filed on Apr. 6, 2001, now Pat. No. 6,608,375.

(51) Int. Cl.[7] .............................................. H01L 23/52
(52) U.S. Cl. ........................ 257/691; 257/723; 257/724; 257/676; 257/532
(58) Field of Search .......................... 257/691, 723–724, 257/676, 532

(56) References Cited

U.S. PATENT DOCUMENTS

| 4,714,952 | A | 12/1987 | Takekawa et al. |
|---|---|---|---|
| 5,378,656 | A | 1/1995 | Kajihara et al. |
| 5,637,913 | A | 6/1997 | Kajihara et al. |
| 5,962,917 | A | 10/1999 | Moriyama |
| 6,400,007 | B1 | 6/2002 | Wu et al. |
| 6,429,536 | B1 | 8/2002 | Liu et al. |
| 6,486,535 | B2 * | 11/2002 | Liu .............................. 257/666 |

FOREIGN PATENT DOCUMENTS

| JP | 05-047992 | 2/1993 |
|---|---|---|
| JP | 05-267557 | 10/1993 |
| JP | 06-216303 | 8/1994 |
| JP | 06-216309 | 8/1994 |
| JP | 07-086489 | 3/1995 |
| JP | 08-070059 | 3/1996 |
| JP | 10-163366 | 6/1998 |
| JP | 10-209327 | 8/1998 |
| JP | 2000-091491 | 3/2000 |
| WO | WO 96/15555 | 5/1996 |

* cited by examiner

Primary Examiner—Luan Thai
(74) Attorney, Agent, or Firm—Rabin & Berdo, P.C.

(57) ABSTRACT

A lead frame type of semiconductor apparatus includes a die pad on which a semiconductor chip is mounted; ground terminals which are to be grounded; power supply terminals which are connected to a power supply; inner leads connected to the ground terminals and power supply terminals, in which a pair of adjacent inner leads for power supply terminal and ground terminal are extended inwardly; a chip capacitor mounting pad which is provided at inner ends of the extended inner leads; and a chip capacitor which is mounted on the chip capacitor mounting pad so that a decoupling capacitor is provided.

5 Claims, 41 Drawing Sheets

(Power Supply System)

(Ground System)

(Power Supply System)

(Ground System)

(Power Supply System)

(Ground System)

(Power Supply System)

(Ground System)

(Power Supply System)

(Ground System)

(Power Supply System)

(Ground System)

(Power Supply System)

(Ground System)

(Power Supply System)

(Ground System)

(Power Supply System)

(Ground System)

(Power Supply System)

(Ground System)

(Power Supply System)

(Ground System)

SEMICONDUCTOR APPARATUS WITH DECOUPLING CAPACITOR

This is a Divisional of U.S. application Ser. No.: 10/211,365, filed Aug. 5, 2002, now U.S. Pat. No. 6,707,146 which was a Divisional of U.S. application Ser. No. 09/827,246, filed Apr. 6, 2001, and issued as U.S. Pat. No. 6,608,375 on Aug. 19, 2003.

TECHNICAL FIELD OF THE INVENTION

The present invention generally relates to a semiconductor apparatus having a decoupling capacitor.

BACKGROUND OF THE INVENTION

A conventional semiconductor chip is provided with electrodes connected to inner leads, arranged around a die pad. The die pad, semiconductor chip, bonding wires, and the inner leads are molded by a mold resin, such as an epoxy resin. The semiconductor package includes outer leads, which are extending outwardly from the package.

A motherboard is provided at the inner layer and outer layer with copper wiring patterns. The motherboard is also provided at both upper and lower surfaces with terminals on which semiconductor devices and chips are mounted. A semiconductor device and chips, such as resistances and capacitors, are mounted on the motherboard using solder paste.

The semiconductor package includes a chip capacitor used in order to reduce a power supply/ground noise. The chip capacitor is arranged between conductive patterns to which power supply terminal and ground terminal are connected.

According to such a conventional semiconductor apparatus, the power supply/ground noise inside the semiconductor package cannot be removed sufficiently. As a result, it is hard to reduce electromagnetic radiation noise generated in the semiconductor package. Further, since a conductive route formed between the semiconductor package and the chip capacitor is long, parasitic inductance is increased. And therefore, the chip capacitor does not effectively function to reduce the power supply/ground noise.

OBJECTS OF THE INVENTION

Accordingly, an object of the present invention is to provide a semiconductor apparatus in which power-supply/ground noise is sufficiently reduced.

Additional objects, advantages and novel features of the present invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

According to a first aspect of the present invention, a lead frame type of semiconductor apparatus includes a die pad on which a semiconductor chip is mounted; ground terminals which are to be grounded; power supply terminals which are connected to a power supply; inner leads connected to the ground terminals and power supply terminals, in which a pair of adjacent inner leads for power supply terminal and ground terminal are extended inwardly; a chip capacitor mounting pad which is provided at inner ends of the extended inner leads; and a chip capacitor which is mounted on the chip capacitor mounting pad so that a decoupling capacitor is provided.

According to a second aspect of the present invention, a lead frame type of semiconductor apparatus includes a die pad on which a semiconductor chip is mounted; ground terminals which are to be grounded; power supply terminals which are supplied with electrical power, in which each one of the ground terminals and each one of the power supply terminals are arranged to be adjacent each other so that a plurality of pairs of ground/power supply terminals are formed; inner leads connected to the ground terminals and power supply terminals; and high dielectric constant material provided between each pair of the ground/power supply terminals so that a decoupling capacitor is formed therein.

According to a third aspect of the present invention, a lead frame type of semiconductor apparatus includes a die pad which comprises a chip mounting area on which a semiconductor chip is mounted and a ground bonding area, which is extended outwardly from the chip mounting area; ground terminals which are to be grounded; power supply terminals which are supplied with electrical power; inner leads connected to the ground terminals and power supply terminals; and chip capacitors connected between the ground bonding area and inner leads connected to the power supply terminals to form decoupling capacitors.

According to a fourth aspect of the present invention, a lead frame type of semiconductor apparatus includes a die pad on which a semiconductor chip is mounted, in which the die pad is divided into even number of areas to form first and second areas; ground terminals which are to be grounded; power supply terminals which are supplied with electrical power; inner leads connected to the ground terminals and power supply terminals, in which the inner leads connected to the ground terminals are connected to the first area of the die pad and the inner leads connected to the power supply terminals are connected to the second area of the die pad; and chip capacitors connected between the first area and second area of the die pad to form decoupling capacitors.

According to a fifth aspect of the present invention, a lead frame type of semiconductor apparatus includes a die pad which comprises a chip mounting area on which a semiconductor chip is mounted and ground bonding areas, which are formed by extending outwardly the opposite two sides of the die pad; ground terminals which are to be grounded; power supply terminals which are supplied with electrical power; inner leads connected to the ground terminals and power supply terminals; power supply bonding areas which are arranged between the die pad and inner lead and are connected to the inner leads connected to the power supply terminals, wherein the power supply bonding areas are arranged at the opposite two sides of the die pad; and chip capacitors connected between the die pad and the power supply bonding areas to form decoupling capacitors.

According to a sixth aspect of the present invention, a lead frame type of semiconductor apparatus includes a die pad which comprises a chip mounting area on which a semiconductor chip is mounted and a ground bonding area, which are formed by extending outwardly all the sides of the die pad so that the ground bonding area surround the chip mounting area; ground terminals which are to be grounded; power supply terminals which are supplied with electrical power; inner leads connected to the ground terminals and power supply terminals; power supply bonding areas which are arranged between the ground bonding area of the die pad and inner lead and are connected to the inner leads connected to the power supply terminals; and chip capacitors connected between the ground bonding area and the power supply bonding areas to form decoupling capacitors.

According to a seventh aspect of the present invention, a lead frame type of semiconductor apparatus includes a die pad which comprises a chip mounting area on which a semiconductor chip is mounted and a ground bonding area, which are formed by extending outwardly all the sides of the die pad so that the ground bonding area surround the chip mounting area; ground terminals which are to be grounded; power supply terminals which are supplied with electrical power; inner leads connected to the ground terminals and power supply terminals; power supply bonding areas which are arranged between the ground bonding area of the die pad and inner lead and are connected to the inner leads connected to the power supply terminals; and a high dielectric constant material arranged between the ground bonding area and the power supply bonding areas to form decoupling capacitors.

According to an eighth aspect of the present invention, a lead frame type of semiconductor apparatus includes a die pad which comprises a power supply bonding area which is formed by extending outwardly all the sides of the die pad; ground terminals which are to be grounded; power supply terminals which are supplied with electrical power; inner leads connected to the ground terminals and power supply terminals, in which the inner leads connected to the power supply terminals are connected to the power supply bonding area of the die pad; a high dielectric constant layer formed on the die pad; and a metal layer formed between the high dielectric constant layer and die pad to have a chip mounting area on which a semiconductor chip is mounted and a ground bonding area surrounding the chip mounting area.

According to a ninth aspect of the present invention, a semiconductor apparatus includes an organic material substrate; a die pad formed on the organic material substrate, a semiconductor chip being mounted on the die pad; ground terminals which are to be grounded; power supply terminals which are supplied with electrical power; first conductive patterns which are formed on the organic material substrate and are connected to the ground terminals; second conductive patterns which are formed on the organic material substrate and are connected to the power supply terminals, in which adjacent two of the first and second conducive patterns are extended inwardly; chip capacitor mounting pads which are provided at inner ends of the extended first and second conductive patterns; and chip capacitors which are mounted on the chip capacitor mounting pads so that a decoupling capacitor is provided.

According to a tenth aspect of the present invention, a semiconductor apparatus includes an organic material substrate; a die pad formed on the organic material substrate to have a chip mounting area on which a semiconductor chip is mounted and a ground bonding area which is formed by extending outwardly each side of the die pad; ground terminals which are to be grounded; power supply terminals which are supplied with electrical power; first conductive patterns which are formed on the organic material substrate and are connected to the ground terminals; second conductive patterns which are formed on the organic material substrate and are connected to the power supply terminals; and chip capacitors which are arranged between the second conductive patterns and the ground bonding area so that a decoupling capacitor is provided.

According to an eleventh aspect of the present invention, a semiconductor apparatus includes an organic material substrate; a die pad formed on the organic material substrate on which a semiconductor chip is mounted, in which the die pad is divided into even number of areas to form first and second areas; ground terminals which are to be grounded; power supply terminals which are supplied with electrical power; first conductive patterns which are formed on the organic material substrate and are connected to the ground terminals and the first area of the die pad; second conductive patterns which are formed on the organic material substrate and are connected to the power supply terminals and the second area of the die pad; and chip capacitors which are arranged between the first and second areas of the die pad so that a decoupling capacitor is provided.

According to a twelfth aspect of the present invention, a semiconductor apparatus includes an organic material substrate; a die pad which is formed on the organic material substrate and comprises a chip mounting area on which a semiconductor chip is mounted and ground bonding areas, which are formed by extending outwardly the opposite two sides of the die pad; ground terminals which are to be grounded; power supply terminals which are supplied with electrical power; first conductive patterns which are formed on the organic material substrate and are connected to the ground terminals; second conductive patterns which are formed on the organic material substrate and are connected to the power supply terminals; power supply bonding areas which are arranged between the die pad and the first and second conductive patterns and are connected to the first conductive patterns, wherein the power supply bonding areas are arranged at the opposite two sides of the die pad; and chip capacitors which are arranged between the die pad and power supply boding area so that a decoupling capacitor is provided.

According to a thirteenth aspect of the present invention, a semiconductor apparatus includes an organic material substrate; a die pad which is formed on the organic material substrate and comprises a chip mounting area on which a semiconductor chip is mounted and ground bonding areas, which are formed by extending outwardly to surround the chip mounting area; ground terminals which are to be grounded; power supply terminals which are supplied with electrical power; first conductive patterns which are formed on the organic material substrate and are connected to the ground terminals; second conductive patterns which are formed on the organic material substrate and are connected to the power supply terminals; power supply bonding areas which are arranged between the ground bonding area of the die pad and the first and second conductive patterns, the power supply bonding area being connected to the second conductive patterns; and chip capacitors which are arranged between the ground bonding area and power supply bonding area so that a decoupling capacitor is provided.

According to a fourteenth aspect of the present invention, a semiconductor apparatus includes an organic material substrate; a die pad which is formed on the organic material substrate and comprises a chip mounting area on which a semiconductor chip is mounted and ground bonding areas, which are formed by extending outwardly to surround the chip mounting area; ground terminals which are to be grounded; power supply terminals which are supplied with electrical power; first conductive patterns which are formed on the organic material substrate and are connected to the ground terminals; second conductive patterns which are formed on the organic material substrate and are connected to the power supply terminals; power supply bonding areas which are arranged between the ground bonding area of the die pad and the first and second conductive patterns, the power supply bonding area being connected to the second conductive patterns; and a high dielectric constant material arranged between the ground bonding area and the power supply bonding areas to form decoupling capacitors.

According to a fifteenth aspect of the present invention, a semiconductor apparatus includes an organic material substrate; a die pad which comprises a power supply bonding area which is formed by extending outwardly all the sides of the die pad; ground terminals which are to be grounded; power supply terminals which are supplied with electrical power; first conductive patterns which are formed on the organic material substrate and are connected to the ground terminals; second conductive patterns which are formed on the organic material substrate and are connected to the power supply terminals; a high dielectric constant layer formed on the die pad; and a metal layer formed between the high dielectric constant layer and die pad to have a chip mounting area on which a semiconductor chip is mounted and a ground bonding area surrounding the chip mounting area.

DETAILED DISCLOSURE OF THE INVENTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and scope of the present inventions is defined only by the appended claims.

Figure 1A:
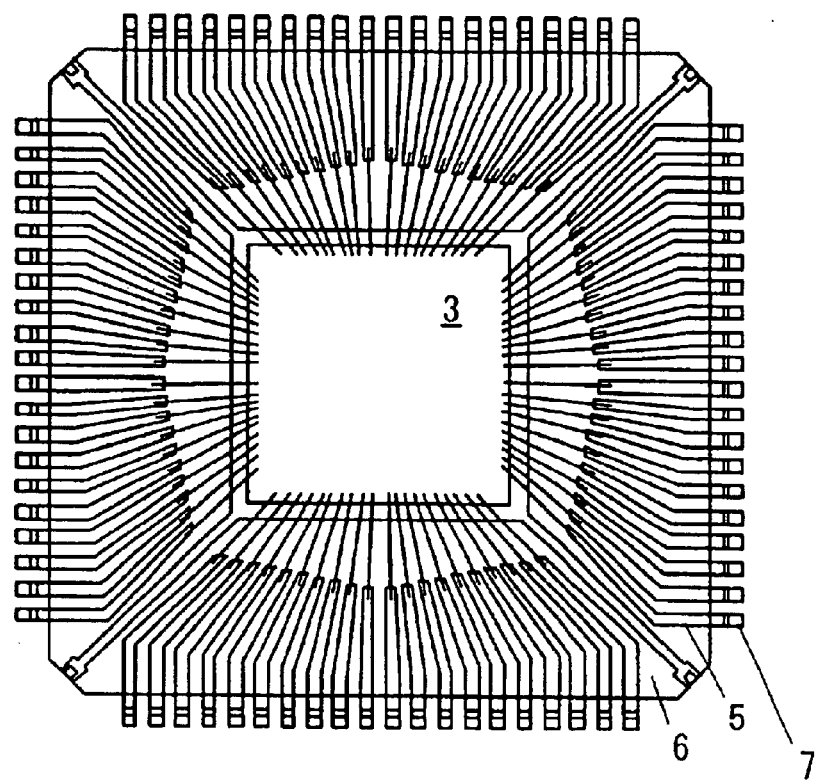
FIG. 1A is a plane view showing an inside of a conventional semiconductor package.
Figure 1B:
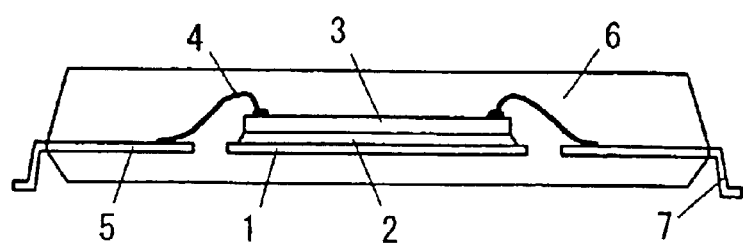
FIG. 1B is a cross-sectional view showing an inside of the conventional semiconductor package, shown in FIG. 1A.
Figure 2:
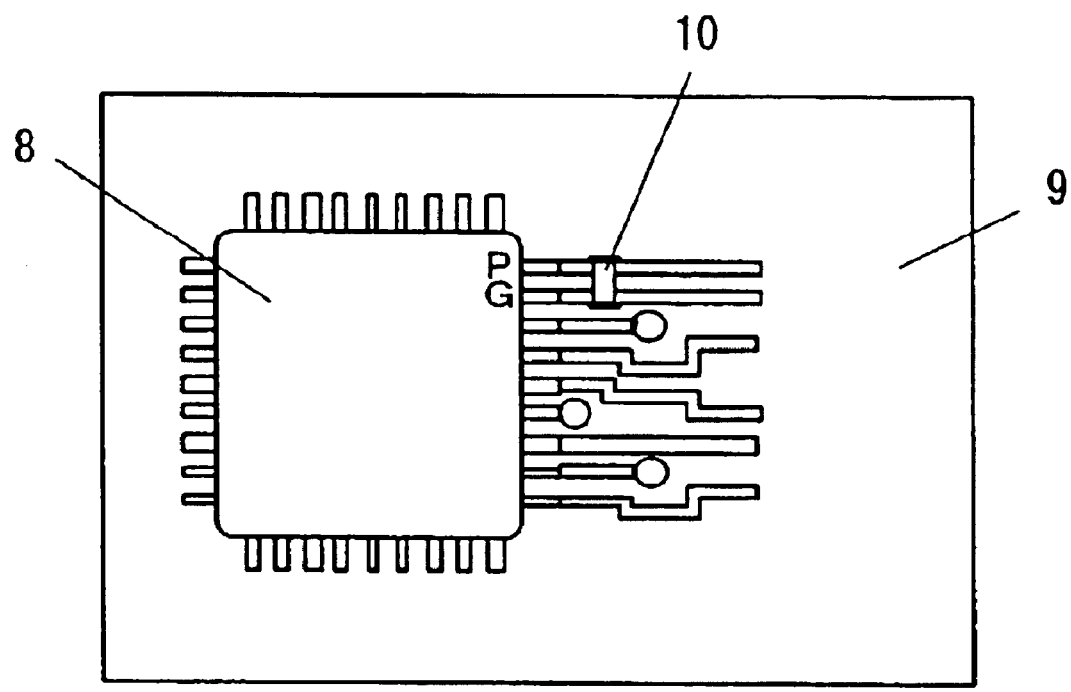
FIG. 2 is a plane view showing the conventional semiconductor package mounted on a motherboard.

For better understanding of the present invention, a conventional technology is first described in conjunction with FIGS. 1A, 1B and 2. FIG. 1A is a plane view showing an inside of a conventional semiconductor package. FIG. 1B is a cross-sectional view showing an inside of the conventional semiconductor package, shown in FIG. 1A. FIG. 2 is a plane view showing the conventional semiconductor package mounted on a motherboard.

In FIG. 1, a semiconductor chip 3 is mounted through conductive paste 2, such as silver-epoxy system adhesives, on a die pad 1. The semiconductor chip 3 is provided with electrodes connected to inner leads 5, arranged around the die pad 1, through bonding wires 4. The die pad 1, semiconductor chip 3, the bonding wires 4, and the inner leads 5 are molded by a mold resin 6, such as an epoxy resin. The semiconductor package includes outer leads 7, which are extending outwardly from the package, and are bent below.

Referring to FIG. 2, a motherboard 9 is manufactured considering organic material, such as glass epoxy, as a base. The motherboard 9 is provided at the inner layer and outer layer with copper wiring patterns. The motherboard 9 is also provided at both upper and lower surfaces with terminals on which semiconductor devices and chips are mounted. A semiconductor device 8 and chips, such as resistances and capacitors, are mounted on the motherboard 9 using solder paste.

The semiconductor package includes a chip capacitor 10 used in order to reduce a power supply/ground noise. The chip capacitor 10 is mounted between conductive patterns to which power supply terminal (P) and ground terminal (G) are connected.

According to such a conventional semiconductor apparatus, the power supply/ground noise inside the semiconductor package 8 cannot be removed sufficiently. As a result, it is hard to reduce electromagnetic radiation noise generated in the semiconductor package 8. Further, since a conductive route formed between the semiconductor package and the chip capacitor 10 is long, parasitic inductance is increased. And therefore, the chip capacitor 10 does not effectively function to reduce the power supply/ground noise.

First Preferred Embodiment

Figure 3:
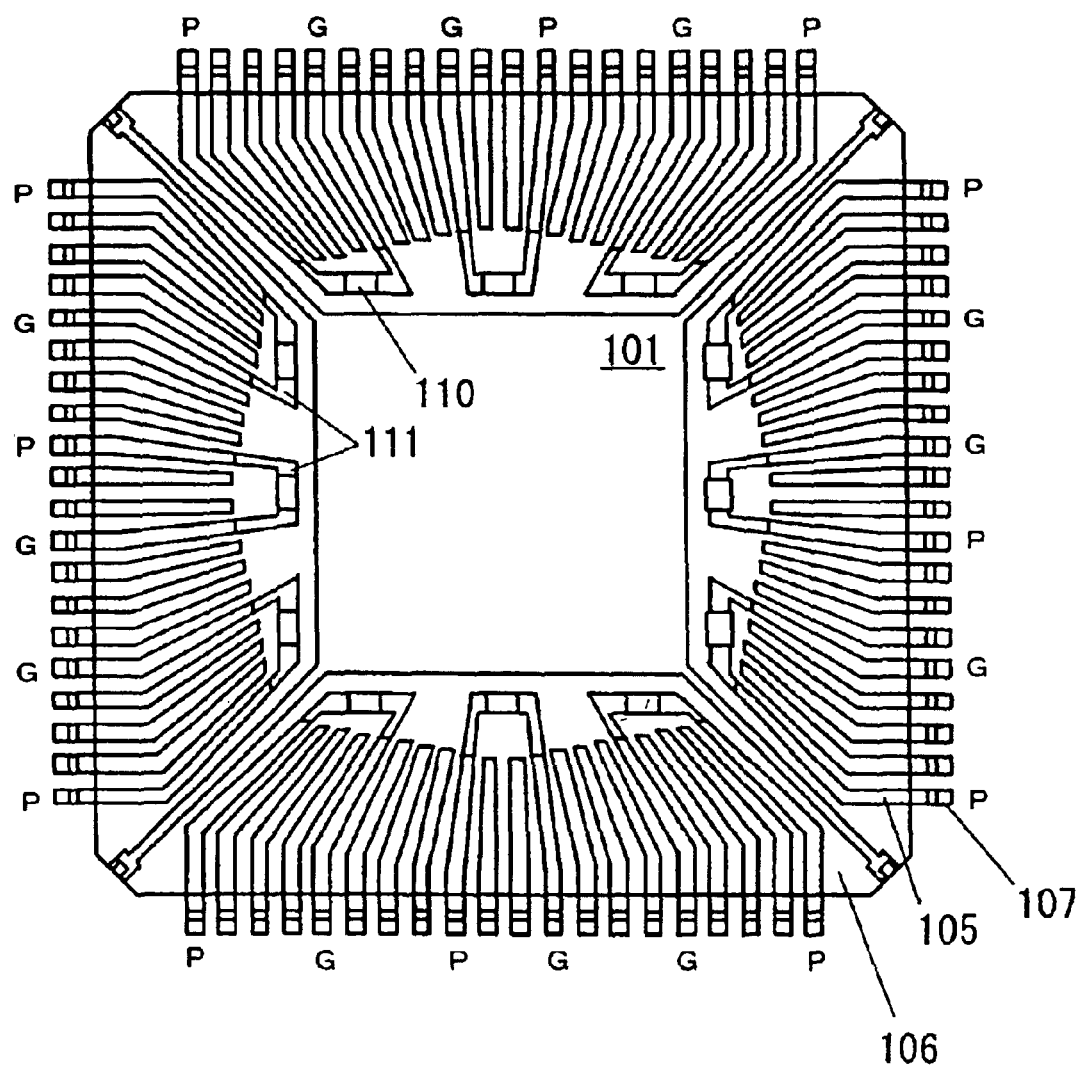
FIG. 3 is a plane view showing an inside of a lead frame type of semiconductor package according to a first preferred embodiment of the present invention.
Figure 4:
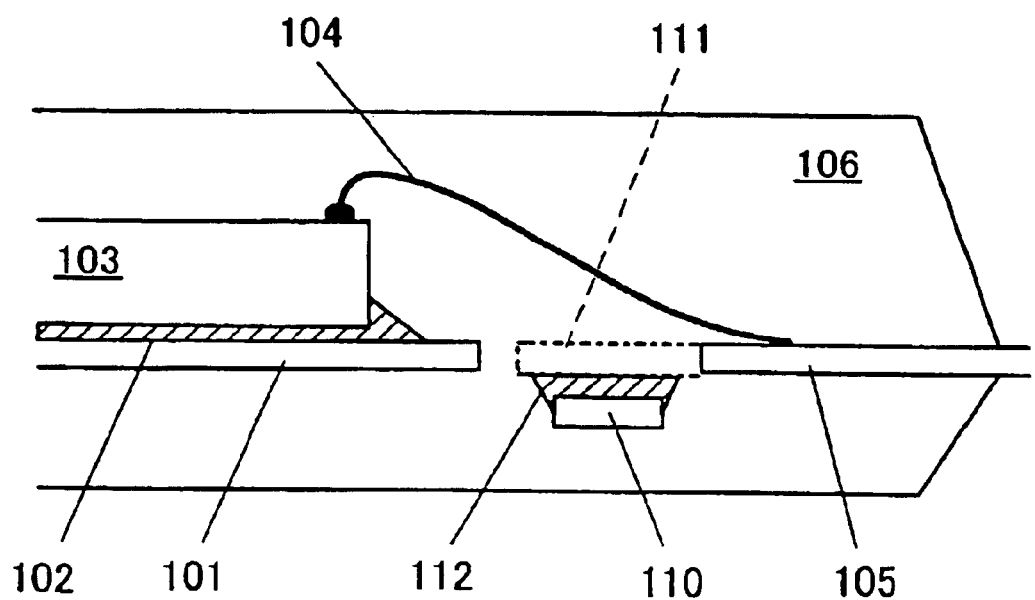
FIG. 4 is a cross-sectional view showing an inside of the semiconductor package, shown in FIG. 3.

FIG. 3 is a plane view showing an inside of a lead frame type of semiconductor package according to a first preferred embodiment of the present invention. FIG. 4 is a cross-sectional view showing an inside of the semiconductor package, shown in FIG. 3. The semiconductor package according to the first preferred embodiment includes a die pad 101, a semiconductor device (chip) 103; inner leads 105 and a mold resin 106.

The semiconductor chip 103 is mounted on the die pad 101 using conductive paste 102. In the drawings, "P" represents a power supply terminal and "G" represents a ground terminal. The inner leads 105, connected to the power supply terminals P and ground terminals G, are extended inwardly toward the semiconductor chip 103. A chip capacitor mounting pad 111 is formed at the inner ends of the adjacent two extended inner leads 105. A chip capacitor 110 is mounted on each of the chip capacitor mounting pads 111 using conductive adhesives 112, such as silver-epoxy system adhesives or solder paste. All of the semiconductor chip 103, chip capacitors 110 and inner leads 105 are molded with the mold resin 106 entirely.

Surface electrodes on the semiconductor chip 103 are connected to the power supply terminals, ground terminals and signal terminals using bonding wires 104. The capacity of each of the chip capacitors 110 is about 0.1 to 1.0 micro F ($\mu$F). Preferably, the number of chip capacitors 110 or total amount of capacity becomes equivalent for every side of the die pad. In FIG. 3, the number of chip capacitors 110 is three for each side of the die pad. The chip capacitors 110 can be mounted on either of the upper and lower surfaces of the chip capacitor mounting pads 111.

The chip capacitors 110 may be mounted on the chip capacitor mounting pads 111 before the wire-bonding process. The chip capacitors 110 may be mounted on the chip capacitor mounting pads 111 just before or after mounting the semiconductor chip 103 on the lead frame, or at the same time of mounting the semiconductor chip 103. The inner leads 105 are extended inwardly not to interfere with other electric elements when the chip capacitors 110 are mounted.

As mentioned above, according to the first preferred embodiment of the present invention, decoupling capacitors 110 can be arranged close to the semiconductor chip 103. In other words, the distance between the decoupling capacitors and semiconductor chip is shortened as compared to the conventional apparatus. As a result, a parasitic inductance is decreased; and therefore, power supply/ground noise is effectively decreased.

Second Preferred Embodiment

Figure 5:
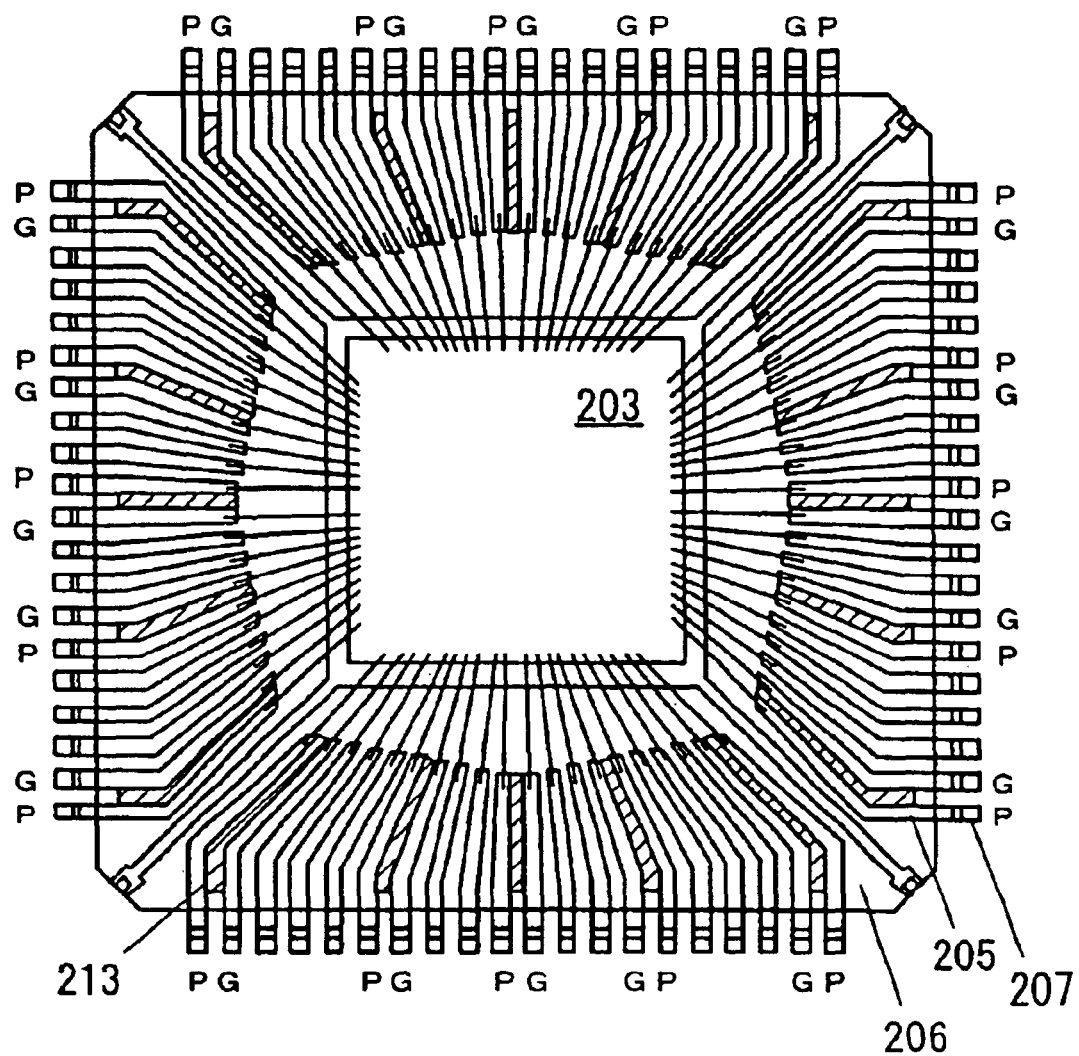
FIG. 5 is a plane view showing an inside of a lead frame type of semiconductor package according to a second preferred embodiment of the present invention.
Figure 6A:
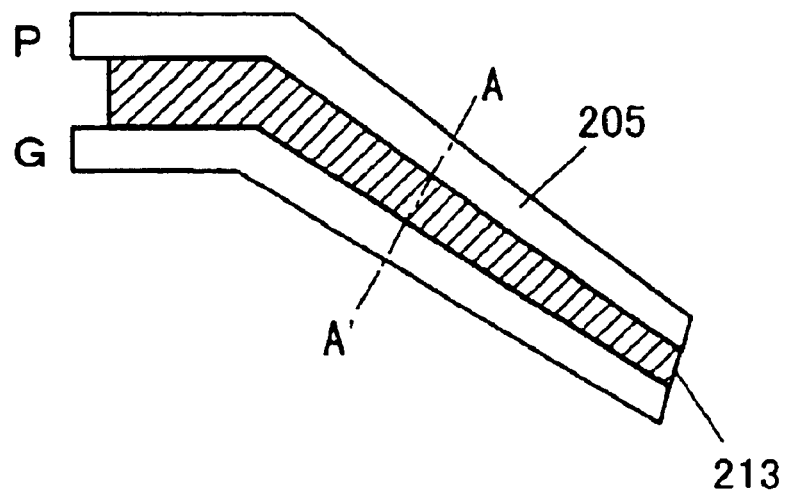
FIG. 6A is a cross-sectional view showing a part of inner leads of the semiconductor package, shown in FIG. 5.
Figure 6B:
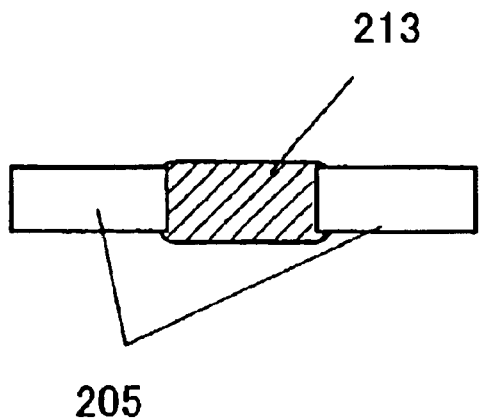
FIG. 6B is a cross-sectional view taken on line A–A' of FIG. 6A.

FIG. 5 is a plane view showing an inside of a lead frame type of semiconductor package according to a second preferred embodiment of the present invention. FIG. 6A is a cross-sectional view showing a part of inner leads of the semiconductor package, shown in FIG. 6. FIG. 6B is a cross-sectional view taken on line A–A' of FIG. 6A. The semiconductor package according to the second preferred embodiment includes a semiconductor device (chip) 203, inner leads 205 and outer leads 207. In the drawings, "P" represents a power supply terminal and "G" represents a ground terminal.

In this embodiment, the power supply terminals P and ground terminals G are arranged adjacent or next to each other. High dielectric constant material 213 is arranged between adjacent power supply terminal P and ground terminal G so as to form a decoupling capacitor between those terminals. Surface electrodes on the semiconductor chip 203 are connected to the power supply terminals P, ground terminals G and signal terminals using bonding wires 204. All of the semiconductor chip 203, high dielectric constant material 213 and inner leads 205 are molded with the mold resin 206 entirely.

The high dielectric constant material 213 may be ceramics, such as alumina (aluminum oxide) and titan oxide. The high dielectric constant material 213 is formed by sintering technique in the fabrication process of the lead frame.

According to the above described second preferred embodiment, decoupling capacitors are formed between adjacent two inner leads (P and G), so that decoupling capacitors 213 can be arranged close to the semiconductor chip 203. In other words, the distance between the decoupling capacitors 213 and semiconductor chip 203 is shortened as compared to the conventional apparatus. As a result, a parasitic inductance is decreased; and therefore, power supply/ground noise is effectively decreased. Further, the decoupling capacitors (213) can be formed before assembly of the semiconductor apparatus. As compared with the first preferred embodiment, the process of mounting a chip capacitor (111) with conductive adhesives (113) becomes unnecessary, and the simplification like the assembler of semiconductor apparatus also becomes possible.

Third Preferred Embodiment

Figure 7:
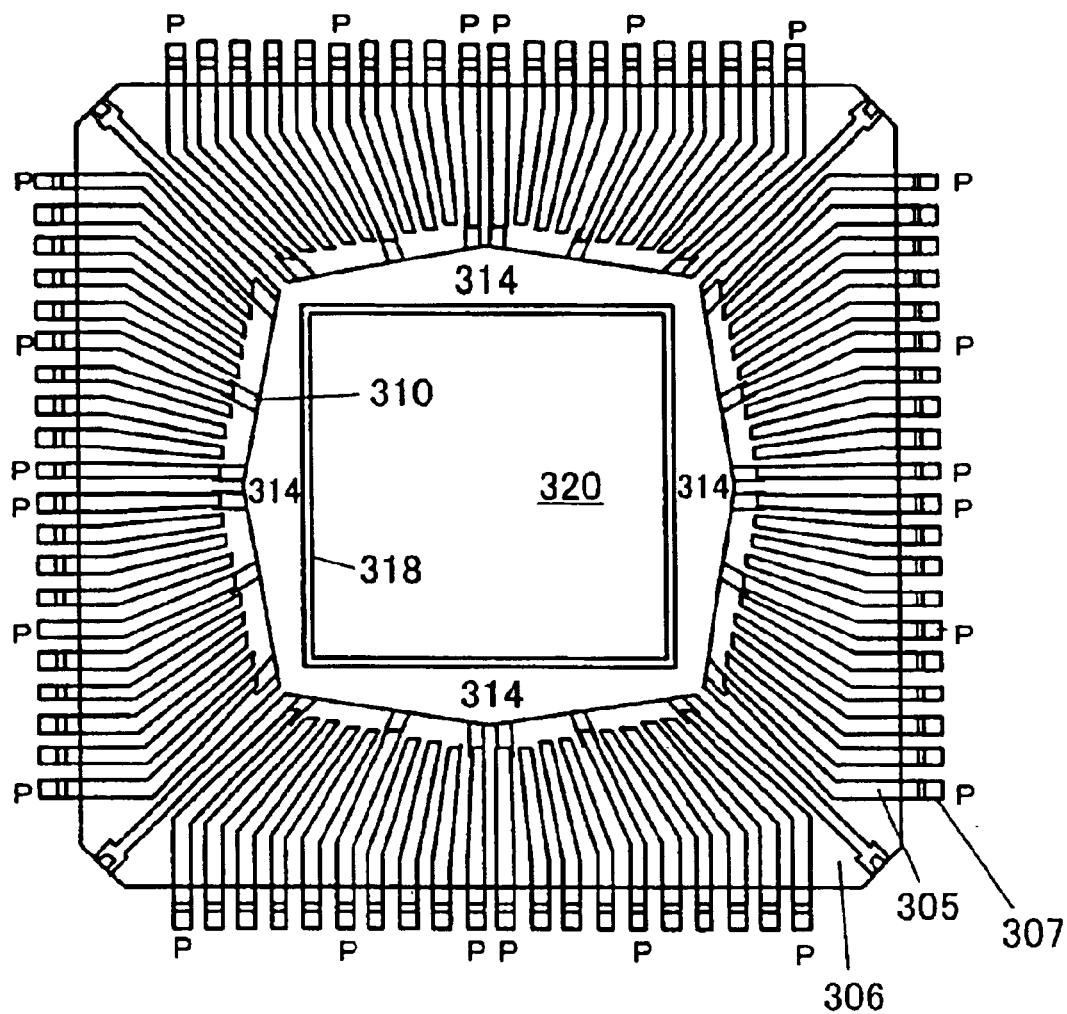
FIG. 7 is a plane view showing an inside of a lead frame type of semiconductor package according to a third preferred embodiment of the present invention.
Figure 8A:
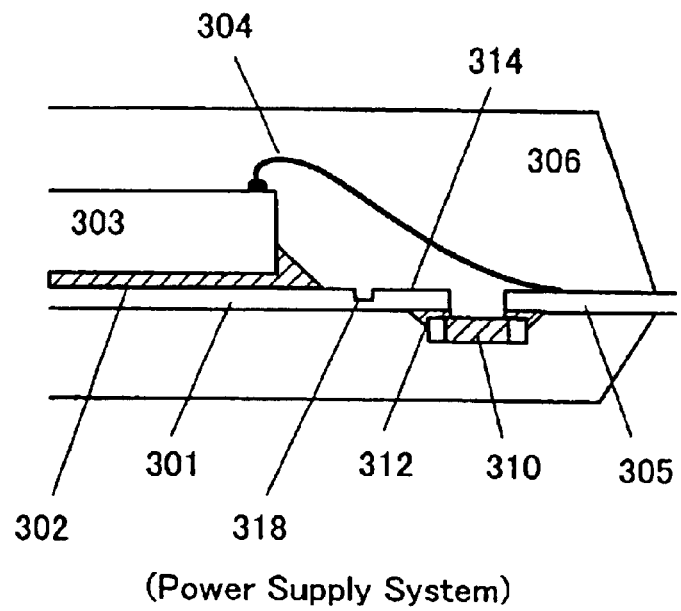
FIG. 8A is a cross-sectional view showing an inside of the semiconductor package, shown in FIG. 7.
Figure 8B:
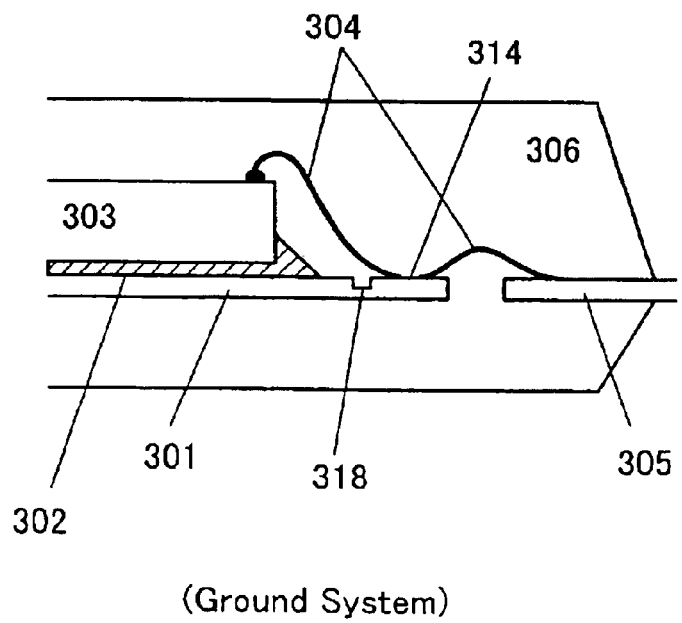
FIG. 8B is a cross-sectional view showing an inside of the semiconductor package, shown in FIG. 7.

FIG. 7 is a plane view showing an inside of a lead frame type of semiconductor package according to a third preferred embodiment of the present invention. FIG. 8A is a cross-sectional view showing an inside of the semiconductor package, shown in FIG. 7. FIG. 8B is a cross-sectional view showing an inside of the semiconductor package, shown in FIG. 7. The semiconductor package according to the third preferred embodiment includes a die pad 301, a semiconductor device (chip) 303 and inner leads 305. The semiconductor chip 303 is mounted on the die pad 301 using conductive paste 302. In the drawings, "P" represents a power supply terminal and "G" represents a ground terminal.

The die pad 301 is expanded outwardly to form a bonding area 314 for ground. Chip capacitors 310 are arranged between the bonding area 314 and the inner leads 305 for power supply terminals "P". Each of the chip capacitors 310 is connected to the inner leads 305 and bonding area 314 using conductive adhesives 312, such as silver-epoxy system adhesives or solder paste. All of the semiconductor chip 303, chip capacitors 310 and inner leads 305 are molded with the mold resin 306 entirely.

As shown in FIG. 8A, surface electrodes for grounds of the semiconductor chip 303 is connected to the inner leads 305 using bonding wires 304. On the other hand, as shown in FIG. 8B, surface electrodes for power supply of the semiconductor chip 303 is connected through the bonding area 314 to the inner leads 305 using bonding wires 304. The capacity of each of the chip capacitors 310 is about 0.1 to 1.0 micro F ($\mu$F). Preferably, the number of chip capacitors 310 or total amount of capacity becomes equivalent for every side of the die pad. In FIG. 7, the number of chip capacitors 310 is six for each side of the die pad.

The die pad 301 is provided at an upper surface with a groove 318, which is shaped the die pad, to have a depth of about 0.05 to 0.08 mm. The groove 318 is formed by half etching technique to define the bonding area 314 and a chip mounting area 320. The groove 318 is designed to prevent the conductive paste 302 from being leaked out toward the bonding area 314.

As mentioned above, according to the third preferred embodiment, the die pad 301 is made into ground potential by connecting the inner leads 305 for ground terminals and surface electrodes for grounds of the semiconductor chip 303 by the bonding wires 304 through the bonding area 314. The chip capacitors 310 are connected between the inner leads 305 for power supply terminals P and the die pad 301. Therefore, decoupling capacitors can be arranged close to the semiconductor chip 303. In other words, the distance between the decoupling capacitors and semiconductor chip 303 is shortened as compared to the conventional apparatus. As a result, a parasitic inductance is decreased; and therefore, power supply/ground noise is effectively decreased.

Further, in this embodiment, the die pad 301 is expanded, the bonding area 314 for grounds is prepared and surface electrodes for grounds and the ground terminals (G) are wired through the bonding area 314 for grounds. Therefore, there is no necessity of wiring surface electrodes for grounds on the semiconductor chip 303 and the ground terminals (G) by the direct bonding wire 304. As a result, the surface electrodes for grounds on the semiconductor chip 303 can be arranged regardless of the position of the ground terminals (G).

Moreover, the bonding area 314 for grounds is formed on the die pad 301 to surround four sides of the die pad 301, so that the number of ground wiring extending from the semiconductor chip 303 can be increased without any restrictions.

Fourth Preferred Embodiment

Figure 9:
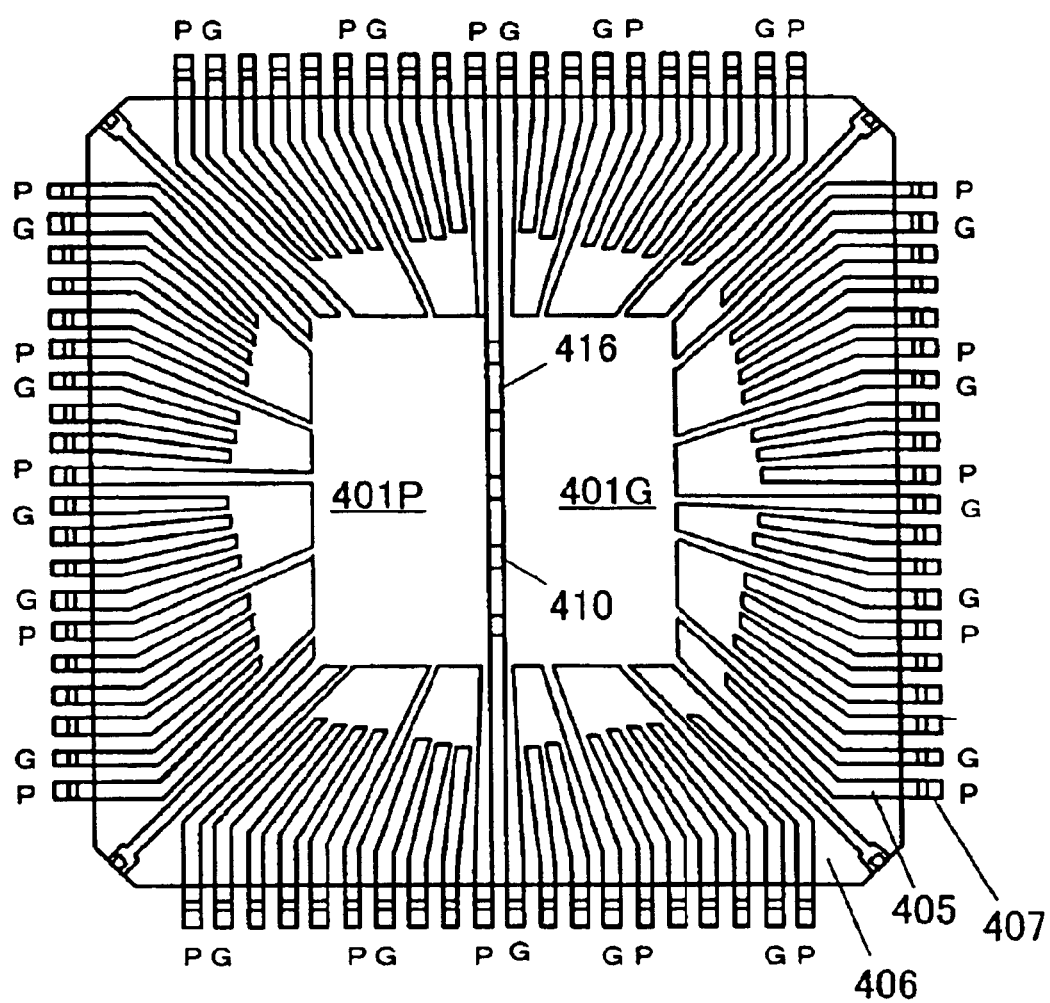
FIG. 9 is a plane view showing an inside of a lead frame type of semiconductor package according to a fourth preferred embodiment of the present invention.
Figure 10:
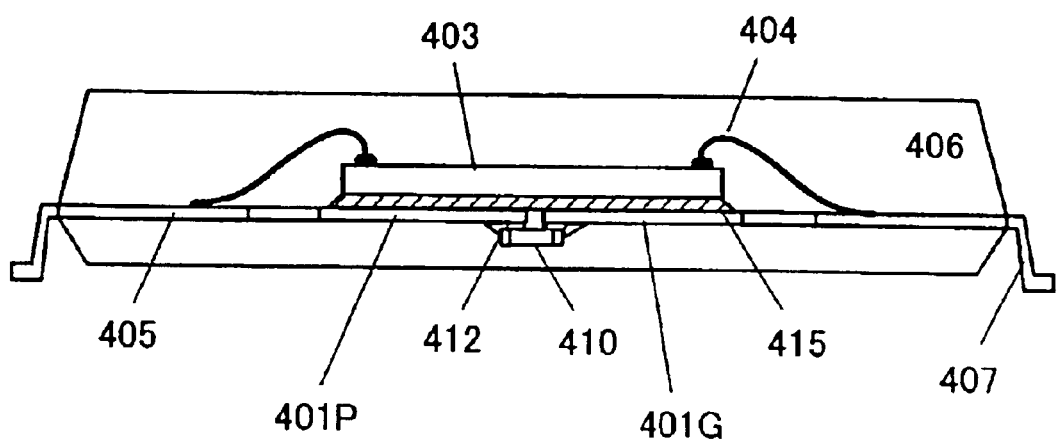
FIG. 10 is a cross-sectional view showing an inside of the semiconductor package, shown in FIG. 9.

FIG. 9 is a plane view showing an inside of a lead frame type of semiconductor package according to a fourth preferred embodiment of the present invention. FIG. 10 is a cross-sectional view showing an inside of the semiconductor package, shown in FIG. 9. The semiconductor chip package according to the fourth preferred embodiment includes a die pad 401p for power supply; a die pad 401g for ground; a semiconductor chip 403; inner leads 405; outer leads 407 connected to the inner leads 405; chip capacitors 410 and a mold resin 406. The die pads 401g and 401p form a slit 416 between them.

A die pad is divided into a half, one die pad 401p is united or integrated with power supply terminals (P), and the other die pad 401g is united or integrated with ground terminals (G). The chip capacitors 410 are arranged under the slit 416 between the two die pads 401p and 401g with conductive adhesives 412, such as silver-epoxy system adhesives or solder paste. AU of the semiconductor chip 403, chip capacitors 410 and inner leads 405 are molded with the mold resin 406 entirely.

The semiconductor chip 403 is mounted on the die pads 401p and 401g using an insulating adhesive 415. The insulating adhesive 415 may be in a paste state or sheet shape. It is desirable that each of the chip capacitors 410 has a capacity of about 0.1 to 1.0 micro F ($\mu$F). As shown in FIG. 10, surface electrodes of the semiconductor chip 403 are connected to the inner leads 405 using bonding wires 404.

As described above, a die pad is divided into a half, and one die pad 401p is made into power supply potential by uniting with the power supply terminals (P), and the die pad 401g of the other side be ground potential by uniting with the ground terminals (G). The chip capacitors 410 arranged between divided die pads 401p and 401g using the conductive adhesives 412, such as silver-epoxy system adhesives or solder paste. Therefore, decoupling capacitors 410 can be arranged close to the semiconductor chip 403. In other words, the distance between the decoupling capacitors 410 and semiconductor chip 403 is shortened as compared to the conventional apparatus. As a result, a parasitic inductance is decreased; and therefore, power supply/ground noise is effectively decreased.

Furthermore, since the area in which the chip capacitors 410 is mounted is large, as compared with the above-described third preferred embodiment. Therefore, the chip capacitors 410 can be arranged or set up easily.

Fifth Preferred Embodiment

Figure 11:
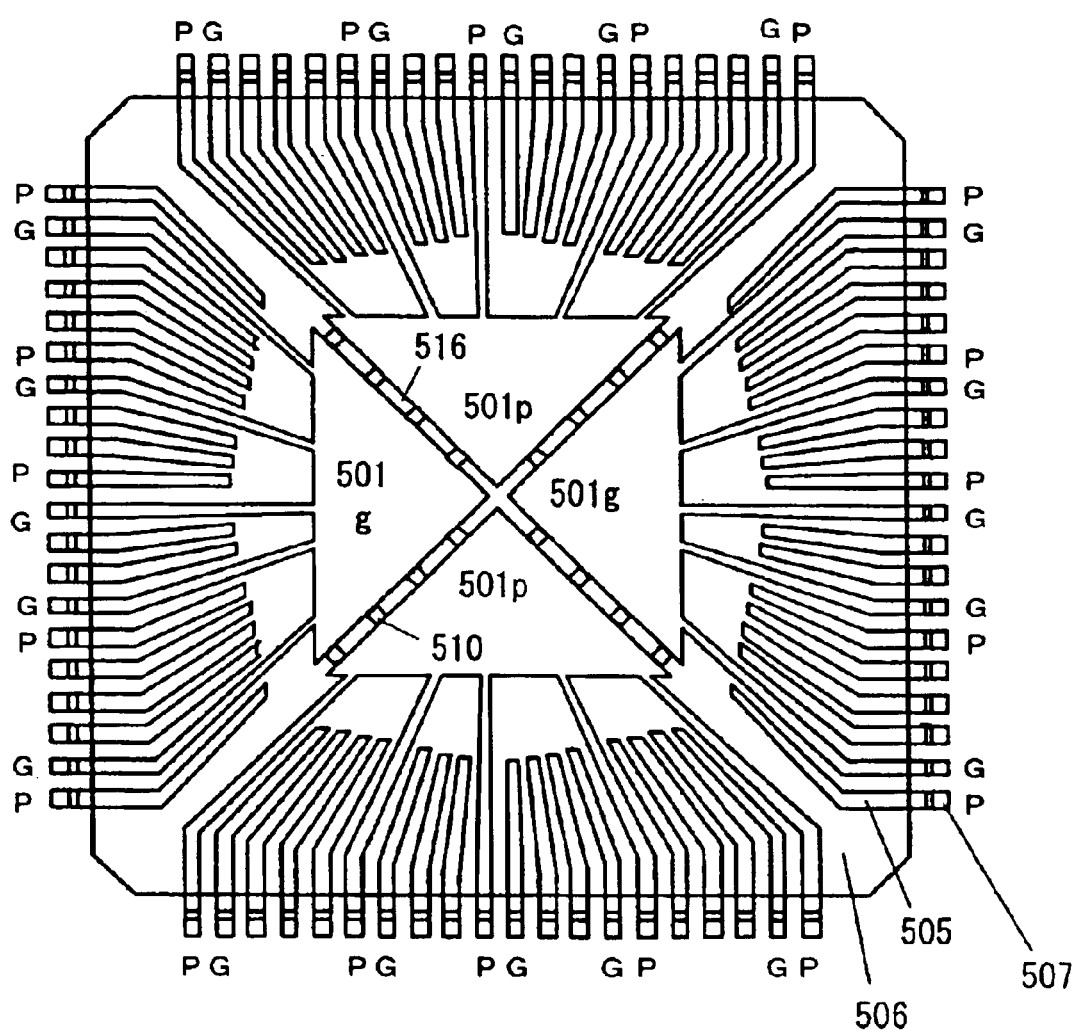
FIG. 11 is a plane view showing an inside of a lead frame type of semiconductor package according to a fifth preferred embodiment of the present invention.
Figure 12:
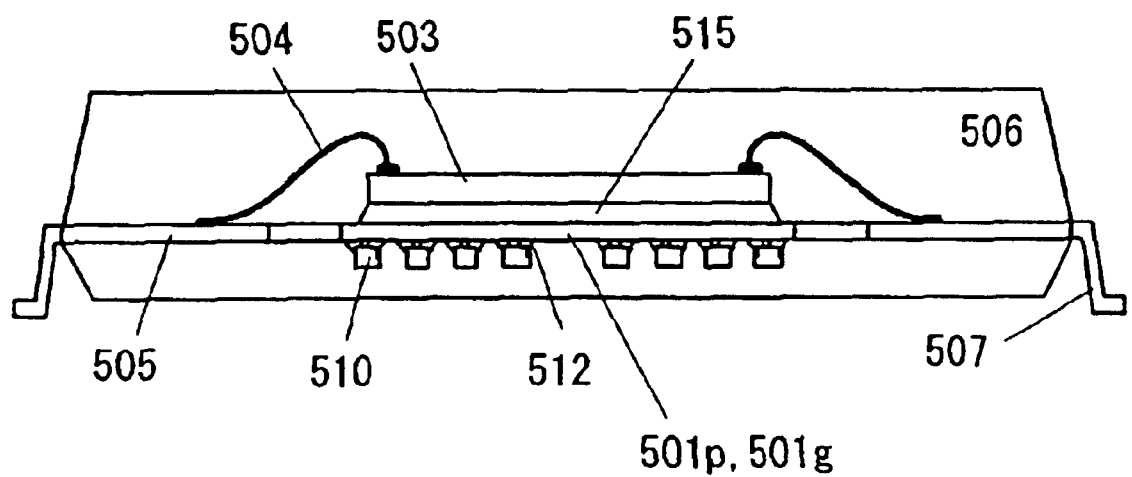
FIG. 12 is a cross-sectional view showing an inside of the semiconductor package, shown in FIG. 11.

FIG. 11 is a plane view showing an inside of a lead frame type of semiconductor package according to a fifth preferred embodiment of the present invention. FIG. 12 is a cross-sectional view showing an inside of the semiconductor package, shown in FIG. 11. The semiconductor chip package according to the fifth preferred embodiment includes a pair of die pads 501p for power supply; a pair of die pads 501g for ground; a semiconductor chip 503; inner leads 505; outer leads 507 connected to the inner leads 505; chip capacitors 510 and a mold resin 506. The adjacent two die pads 501g and 501p form a slit 516 between them.

The die pad is divided into four pieces (501p and 501g). The die pads 501p are united or integrated with power supply terminals P, while the die pads 501g are united or integrated with the ground terminals (G). Those die pads 501p and 501g are arranged by turns. The chip capacitors 510 are adhered in the slits 516 with conductive adhesives 512, such as silver-epoxy system adhesives or solder paste. The die pad can be divided not only by four but also by other even number, such as six and eight.

The semiconductor chip 503 is mounted on the die pads 501p and 501g with an insulating paste 515, which may be in paste state of sheet shape. Preferably, each of the chip capacitors 510 has a capacity of about 0.1 to 1.0 micro F ($\mu$F). As shown in FIG. 12, surface electrodes of the semiconductor chip 503 are connected to the inner leads 505 using bonding wires 504.

As described above, a die pad is divided into four or more, and die pads 501p are made into power supply potential by uniting with the power supply terminals (P), and the die pads 501g of the other side be ground potential by uniting with the ground terminals (G). The chip capacitors 510 arranged between divided die pads 601p and 501g using the conductive adhesives 512, such as silver-epoxy system adhesives or solder paste. Therefore, decoupling capacitors 510 can be arranged close to the semiconductor chip 503. In other words, the distance between the decoupling capacitors 510 and semiconductor chip 503 is shortened as compared to the conventional apparatus. As a result, a parasitic inductance is decreased; and therefore, power supply/ground noise is effectively decreased.

Furthermore, when the die pad is divided into more number, more chip capacitors 510 can be used.

Sixth Preferred Embodiment

Figure 13:
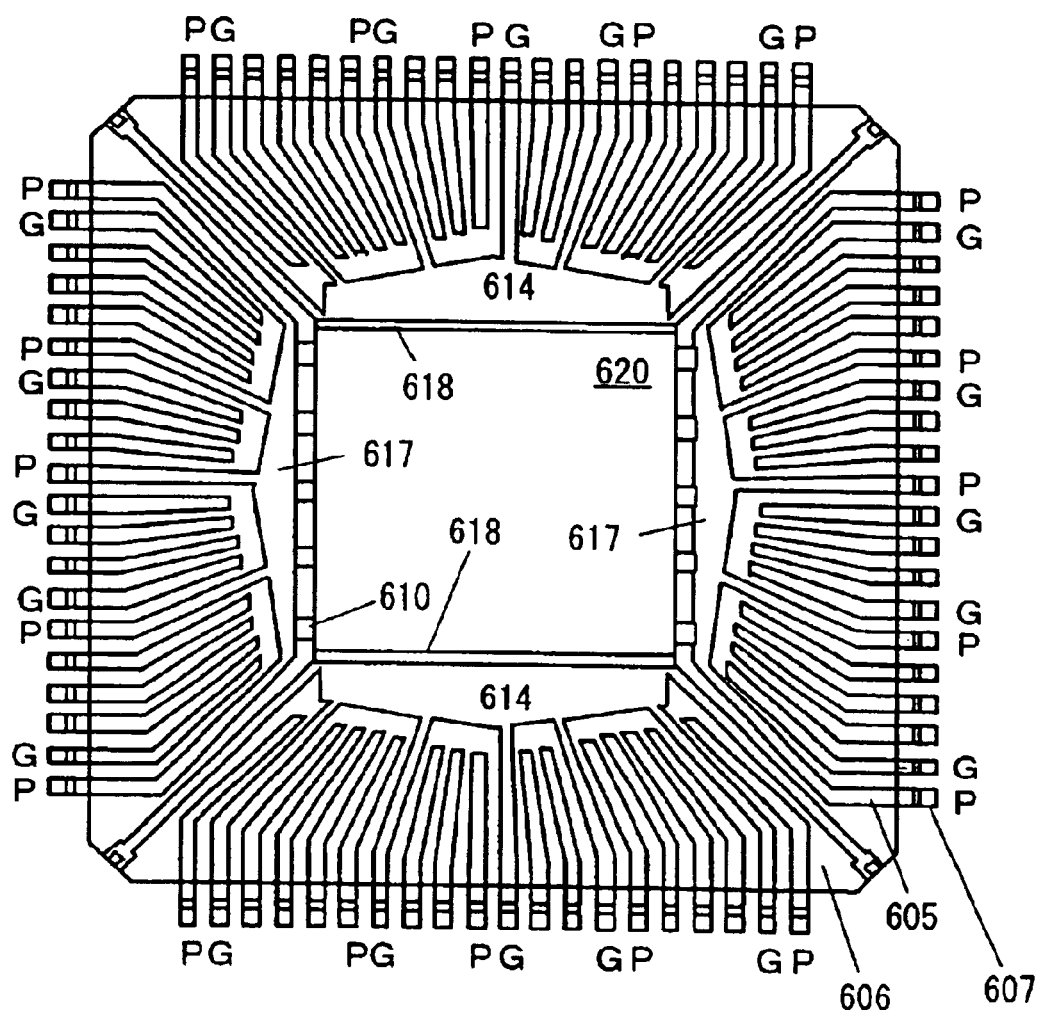
FIG. 13 is a plane view showing an inside of a lead frame type of semiconductor package according to a sixth preferred embodiment of the present invention.
Figure 14A:
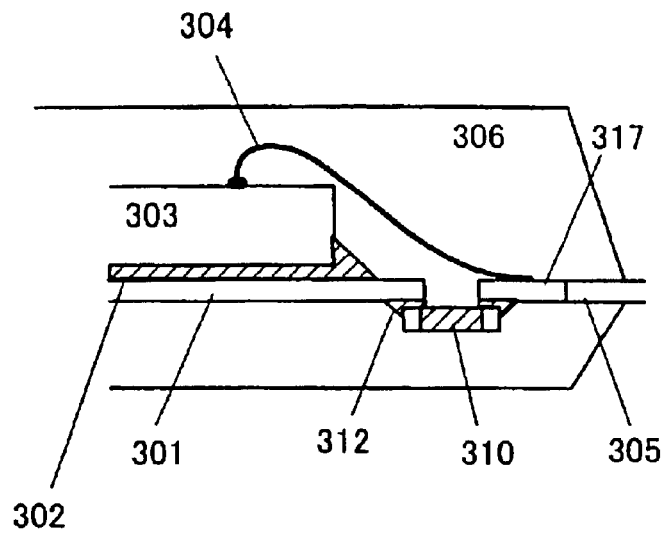
FIG. 14A is a cross-sectional view showing an inside of the semiconductor package, shown in FIG. 13.
Figure 14B:
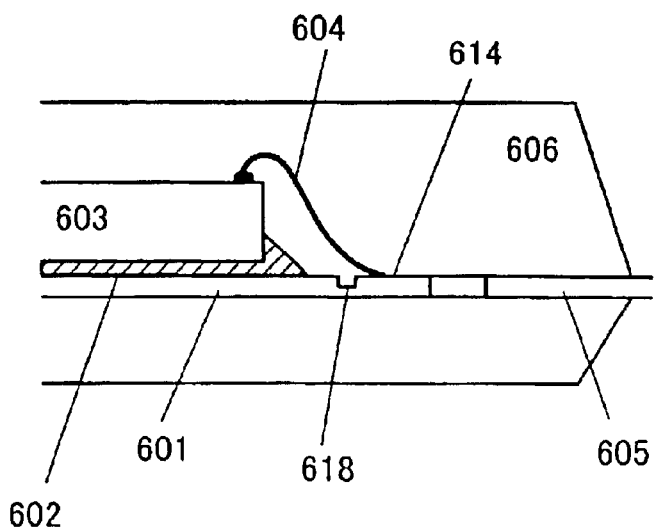
FIG. 14B is a cross-sectional view showing an inside of the semiconductor package, shown in FIG. 13.

FIG. 13 is a plane view showing an inside of a lead frame type of semiconductor package according to a sixth preferred embodiment of the present invention. FIGS. 14A and 14B are cross-sectional views each showing an inside of the semiconductor package, shown in FIG. 13. The semiconductor chip package according to the sixth preferred embodiment includes a die pad 601; a semiconductor chip 603 mounted on the die pad 601; inner leads 605; outer leads 607 connected to the inner leads 605; chip capacitors 610 and a mold resin 606.

The semiconductor package further includes a pair of ground-bonding regions 614, which are located opposite side of the die pad 601. The ground-bonding regions 614 are formed by expanding the opposite two sides of the die pad 601. The semiconductor package further includes a pair of supply-bonding regions 617, which are located opposite side of the die pad 601. The ground bonding regions 614 are united or integrated with ground terminals (G), while the supply bonding regions 617 are united or integrated with power supply terminals (P). The chip capacitors 610 are adhered between the supply bonding regions 617 and the die pad 601 using conductive adhesives 612, such as silver-epoxy system adhesives or solder paste.

The die pad 601 is provided with grooves 618 to define the ground bonding regions 614 and a device-mounting region 620. The semiconductor chip 603 is mounted on the device-mounting region 620 with a conductive paste 602. The grooves 618 are formed by half-etching technique to have a depth of 0.05 to 0.08 mm. The grooves 618 are designed to prevent the conductive paste 602 from being leaked out toward the bonding regions 614.

As shown in FIG. 14A, surface electrodes for power supply of the semiconductor chip 603 are connected through the supply bonding regions 617 to the inner leads 605 using bonding wires 604. As shown in FIG. 14B, surface electrodes for ground of the semiconductor chip 603 are connected through the ground bonding regions 614 to the inner leads 605 using the bonding wires 604.

The capacity of each of the chip capacitors 610 is about 0.1 to 1.0 micro F ($\mu$F). Preferably, the number of chip capacitors 610 or total amount of capacity becomes equivalent for every side of the die pad. In FIG. 13, the number of chip capacitors 610 is five for each of the power-supply side of the die pad 601.

As described above, according to the sixth preferred embodiment of the present invention, decoupling capacitors 610 can be arranged close to the semiconductor chip 603. In other words, the distance between the decoupling capacitors 610 and semiconductor chip 603 is shortened as compared to the conventional apparatus. As a result, a parasitic inductance is decreased; and therefore, power supply/ground noise is effectively decreased.

Furthermore, the package includes the bonding regions 614 and 617 for ground and power supply, so that a large number of conductive lines, extending from the semiconductor chip 603, can be formed and connected to the ground and power supply terminals (G and P).

Seventh Preferred Embodiment

Figure 15:
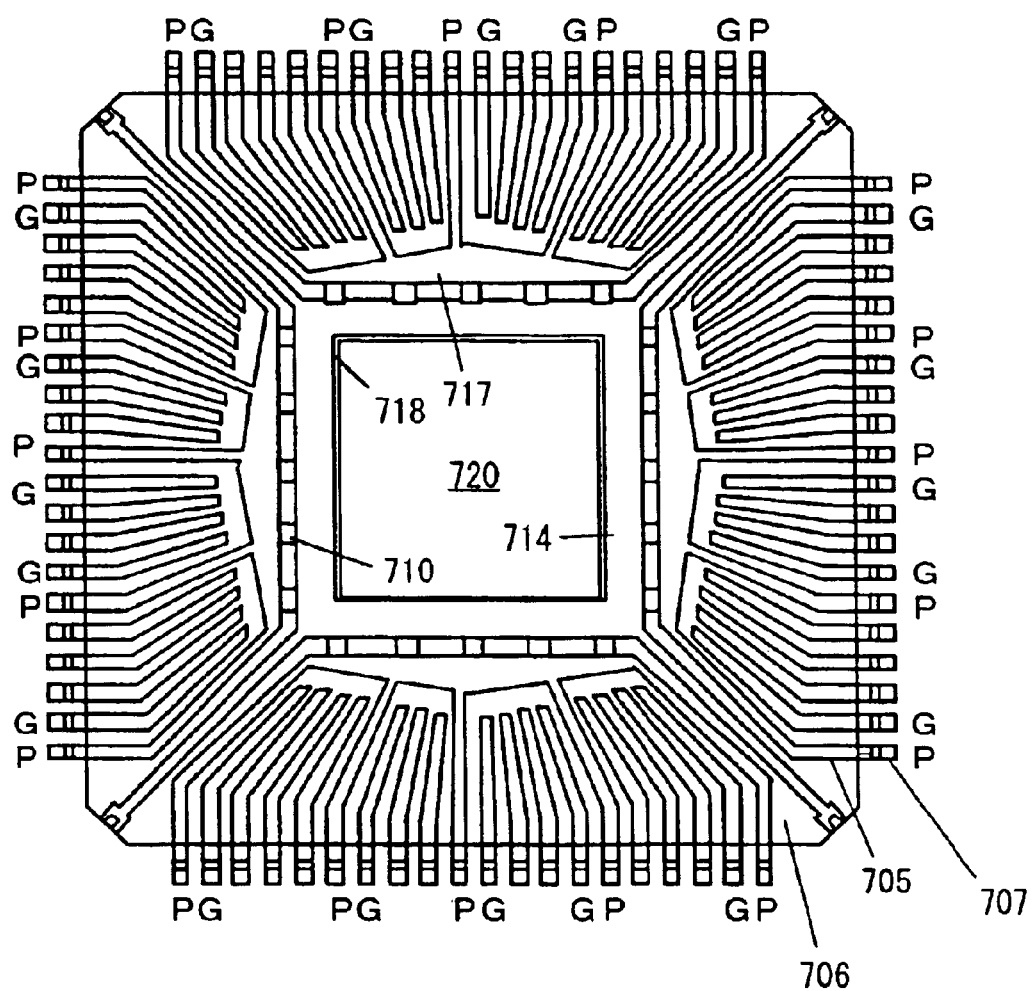
FIG. 15 is a plane view showing an inside of a lead frame type of semiconductor package according to a seventh preferred embodiment of the present invention.
Figure 16A:
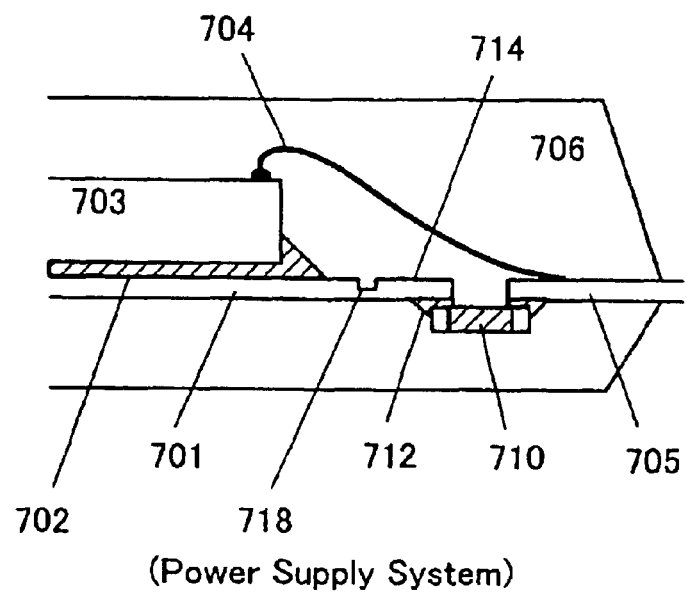
FIG. 16A is a cross-sectional view showing an inside of the semiconductor package, shown in FIG. 15.
Figure 16B:
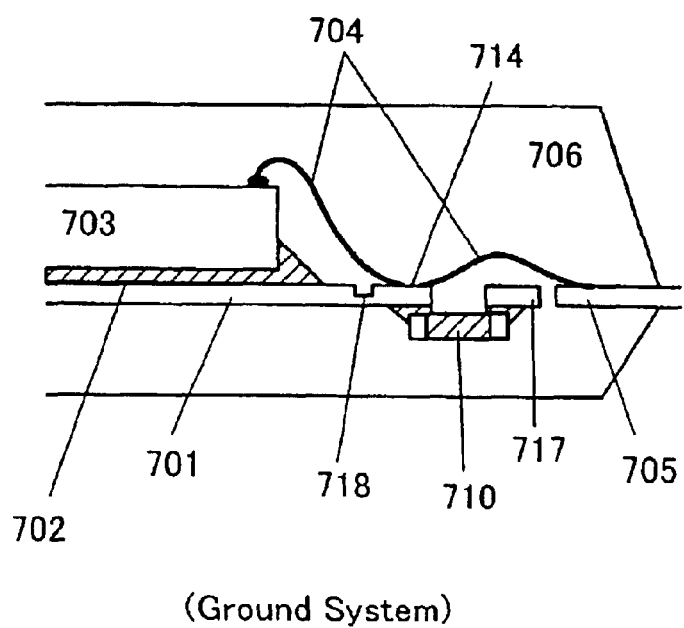
FIG. 16B is a cross-sectional view showing an inside of the semiconductor package, shown in FIG. 15.

FIG. 15 is a plane view showing an inside of a lead frame type of semiconductor package according to a seventh preferred embodiment of the present invention. FIGS. 16A and 16B are cross-sectional views showing an inside of the semiconductor package, shown in FIG. 15. The semiconductor chip package according to the seventh preferred embodiment includes a die pad 701; a semiconductor chip 703 mounted on the die pad 701; inner leads 705; outer leads 707 connected to the inner leads 705; chip capacitors 710 and a mold resin 706.

The die pad 701 is expanded at every side to form bonding areas 714 for ground. The semiconductor package further includes bonding areas 717 for power supply, which are facing the bonding areas 714 for ground one by one. The power supply bonding areas 717 are formed to be united or integrated with power supply terminals (P). The chip capacitors 710 are adhered between the ground bonding areas 714 and supply bonding areas 717 using conductive adhesives 712, such as silver-epoxy system adhesives or solder paste.

The die pad 701 is provided with a groove 718 surrounding a chip mounting area 720 on which the semiconductor chip 703 is mounted with a conductive paste 702. The groove 718 is formed by half-etching technique to have a depth of 0.05 to 0.08 mm. The groove 718 is designed to prevent the conductive paste 702 from being leaked out toward the bonding regions 714.

As shown in FIG. 16A, surface electrodes for power supply of the semiconductor chip 703 are connected through the supply bonding regions 717 to the inner leads 705 using bonding wires 704. As shown in FIG. 16B, surface electrodes for ground of the semiconductor chip 703 are connected through the ground bonding regions 714 to the inner leads 705 using the bonding wires 704.

The capacity of each of the chip capacitors 710 is about 0.1 to 1.0 micro F ($\mu$F). Preferably, the number of chip capacitors 710 or total amount of capacity becomes equivalent for every side of the die pad 701. In FIG. 15, the number of chip capacitors 710 is five for each side of the die pad 701.

As described above, according to the seventh preferred embodiment of the present invention, decoupling capacitors 710 can be arranged close to the semiconductor chip 703. In other words, the distance between the decoupling capacitors 710 and semiconductor chip 703 is shortened as compared to the conventional apparatus. As a result, a parasitic inductance is decreased; and therefore, power supply/ground noise is effectively decreased.

Furthermore, the package includes the bonding areas 714 and 717 at every side of the die pad 701, so that a large number of conductive lines, extending from the semiconductor chip 703, can be formed and connected to the ground and power supply terminals (G and P).

Eighth Preferred Embodiment

Figure 17:
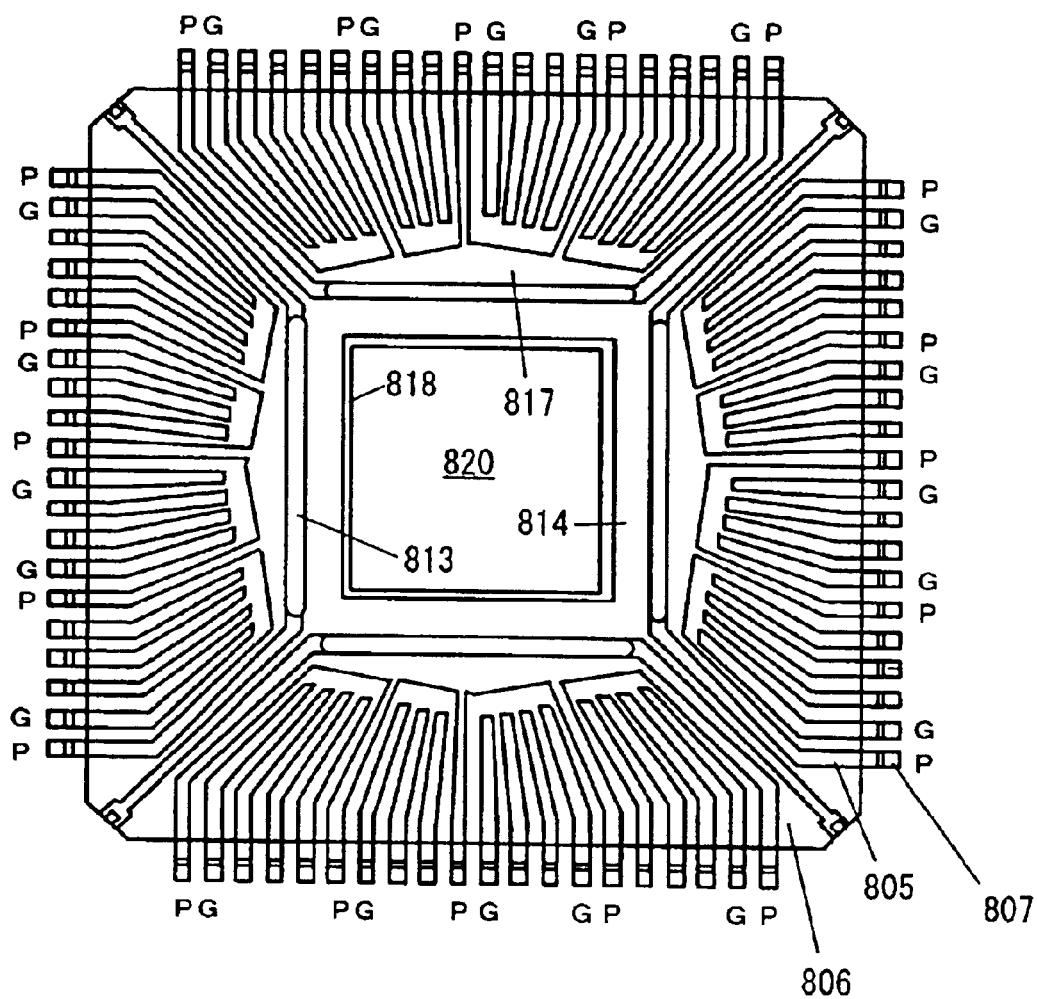
FIG. 17 is a plane view showing an inside of a lead frame type of semiconductor package according to an eighth preferred embodiment of the present invention.
Figure 18A:
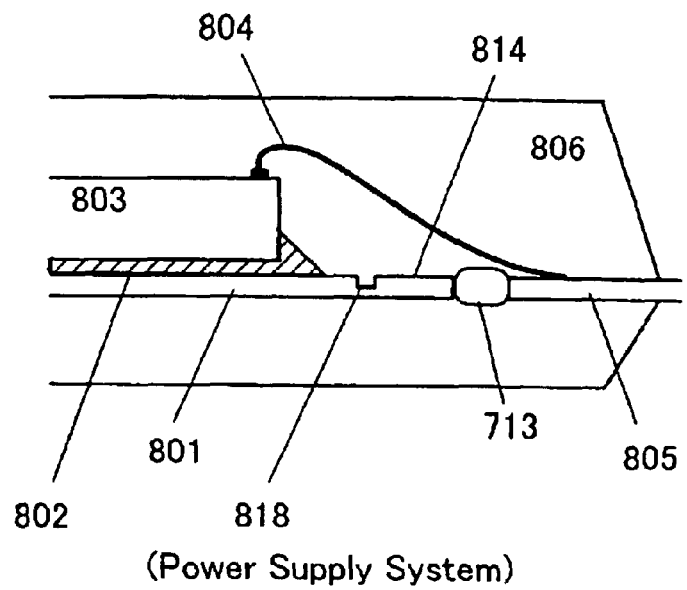
FIG. 18A is a cross-sectional view showing an inside of the semiconductor package, shown in FIG. 17.
Figure 18B:
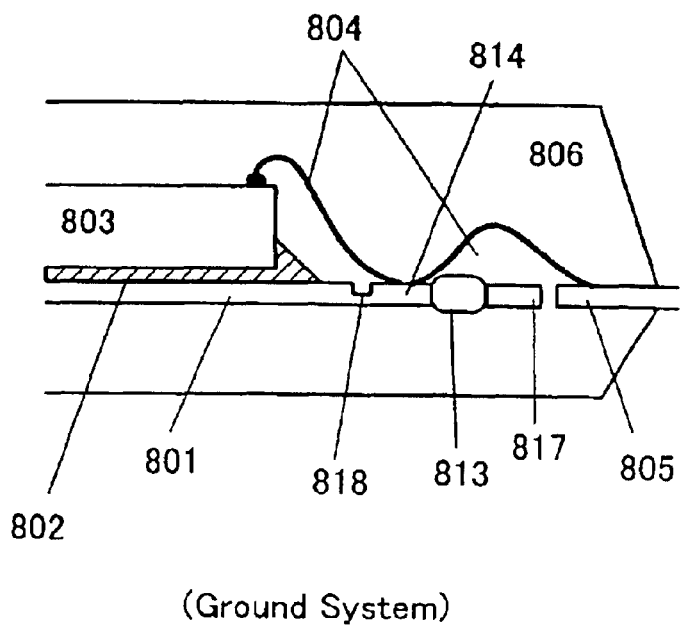
FIG. 18B is a cross-sectional view showing an inside of the semiconductor package, shown in FIG. 17.

FIG. 17 is a plane view showing an inside of a lead frame type of semiconductor package according to an eighth preferred embodiment of the present invention. FIGS. 18A and 18B are cross-sectional views showing an inside of the semiconductor package, shown in FIG. 17. The semiconductor chip package according to the eighth preferred embodiment includes a die pad 801; a semiconductor chip 803 mounted on the die pad 801; inner leads 805; outer leads 807 connected to the inner leads 805 and a mold resin 806.

The die pad 801 is expanded at every side to form bonding areas 814 for ground. The semiconductor package further includes bonding areas 817 for power supply, which are facing the bonding areas 814 for ground one by one. The power supply bonding areas 817 are formed to be united or integrated with power supply terminals (P). In gaps formed between the ground bonding areas 814 and power supply bonding areas 817, high dielectric constant material 813 is formed. The high dielectric constant material 813 may be ceramics, such as alumina (aluminum oxide) and titan oxide. The high dielectric constant material 813 may be adhered in the gaps between the bonding areas 814 and 817.

The die pad 801 is provided with a groove 818 surrounding a chip mounting area 820 on which the semiconductor chip 803 is mounted with a conductive paste 802. The groove 818 is formed by half-etching technique to have a depth of 0.05 to 0.08 mm. The groove 718 is designed to prevent the conductive paste 802 from being leaked out toward the bonding regions 814.

As shown in FIG. 18A, surface electrodes for power supply of the semiconductor chip 803 are connected through the supply bonding regions 817 to the inner leads 805 using bonding wires 804. As shown in FIG. 18B, surface electrodes for ground of the semiconductor chip 803 are connected through the ground bonding regions 814 to the inner leads 805 using the bonding wires 804.

As described above, according to the eighth preferred embodiment of the present invention, decoupling capacitors 813 can be arranged close to the semiconductor chip 803. In other words, the distance between the decoupling capacitors 813 and semiconductor chip 803 is shortened as compared to the conventional apparatus. As a result, a parasitic inductance is decreased; and therefore, power supply/ground noise is effectively decreased.

Furthermore, the package includes the bonding areas 814 and 817 at every side of the die pad 801, so that a large number of conductive lines, extending from the semiconductor chip 803, can be formed and connected to the ground and power supply terminals (G and P). In addition, the decoupling capacitors 813 can be formed before the semiconductor chip 803 is mounted; and therefore, the fabricating process of the semiconductor package becomes simple as compared with the case of using chip capacitors.

Ninth Preferred Embodiment

Figure 19:
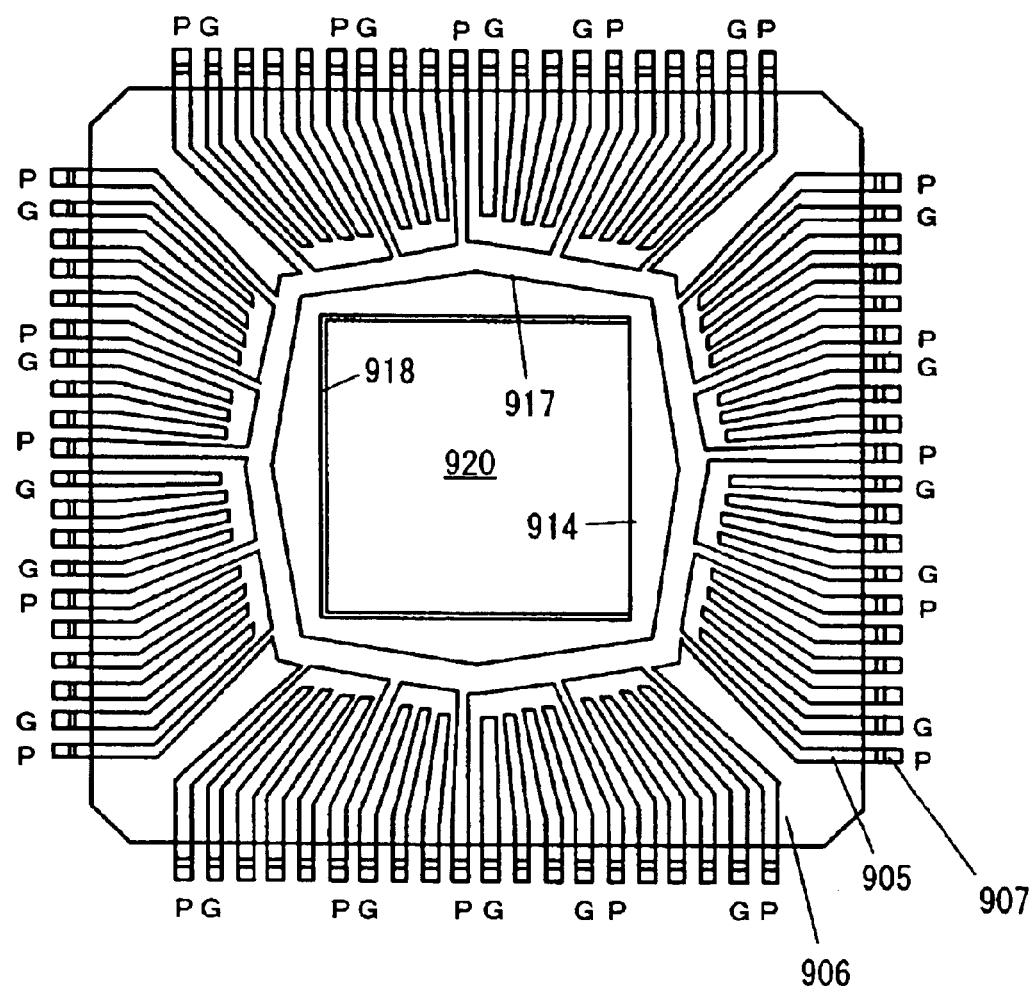
FIG. 19 is a plane view showing an inside of a lead frame type of semiconductor package according to a ninth preferred embodiment of the present invention.
Figure 20A:
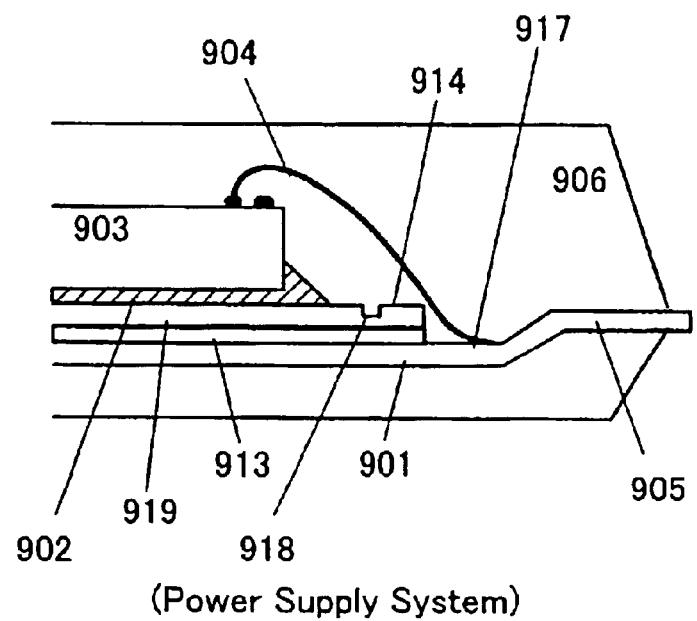
FIG. 20A is a cross-sectional view showing an inside of the semiconductor package, shown in FIG. 19.
Figure 20B:
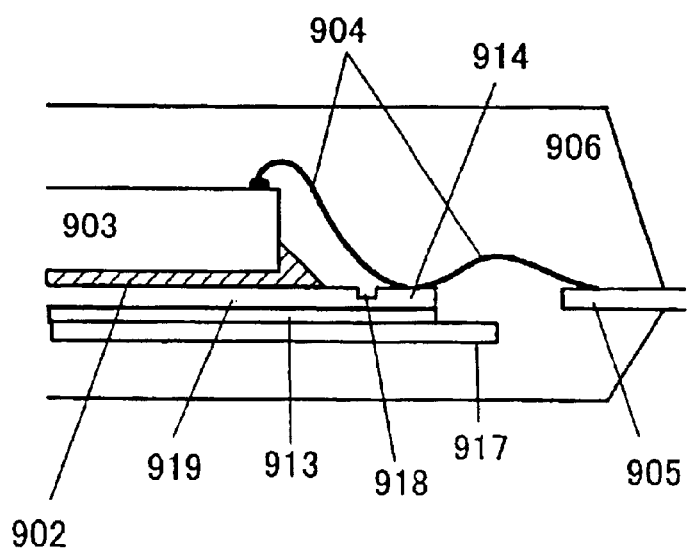
FIG. 20B is a cross-sectional view showing an inside of the semiconductor package, shown in FIG. 19.

FIG. 19 is a plane view showing an inside of a lead frame type of semiconductor package according to a ninth preferred embodiment of the present invention. FIGS. 20A and 20B are cross-sectional views showing an inside of the semiconductor package, shown in FIG. 19. The semiconductor chip package according to the ninth preferred embodiment includes a die pad 901; a semiconductor chip 903 mounted on the die pad 901; inner leads 905; outer leads 907 connected to the inner leads 905 and a mold resin 906.

The die pad 901 is expanded at every side to form bonding area 917 for power supply. The semiconductor package further includes a plate 913 of high dielectric constant material provided on the die pad 901. On the plate 913, a metal plate 919 is formed. The high dielectric constant material 913 may be ceramics, such as alumina (aluminum oxide) and titan oxide. The plate 913 may be adhered between the die pad 901 and metal plate 919. The die pad 901 is bent by about 0.1 to 0.3 mm around a chip mounting area 920 so that the inner leads 905 becomes higher in level than the chip mounting area 920. The metal plate 919 is shaped to be slightly (0.5 to 1.0 mm) smaller than the die pad 901.

The metal plate 919 is provided with a groove 918 surrounding the chip mounting area 920 to have a depth of about 0.05 to 0.08 mm to divide the chip mounting area from the bonding area 914. The groove 918 may be formed by half etching technique. The groove 918 is designed to prevent the conductive paste 902 from being leaked out toward the bonding region 914. The die pad 901 is provided with a bonding area 917 for power supply which is formed to be united or integrated with power supply terminals (P). The power supply bonding area 917 is formed based on the size difference between the die pad 901 and metal plate 919. In other words, the power supply bonding area 917 is a part of the die pad 901 that is not covered with the metal plate 919.

As shown in FIG. 20A, surface electrodes for power supply of the semiconductor chip 903 are connected through the supply bonding area 917 to the inner leads 905 using bonding wires 904. As shown in FIG. 20B, surface electrodes for ground of the semiconductor chip 903 are connected through the ground bonding area 914 to the inner leads 905 using the bonding wires 904.

In fabrication, the semiconductor chip 903 is mounted on the chip mounting area 920 of the metal plate 919 with the conductive paste 902. After that, surface electrodes for power supply of the semiconductor chip 903 are connected through the supply bonding area 917 to the power supply terminal (P) using bonding wires 904, as shown in FIG. 20A. The surface electrodes for ground of the semiconductor chip 903 are connected through the ground bonding area 914 to the ground terminals (G) using the bonding wires 904.

As described above, according to the ninth preferred embodiment of the present invention, a decoupling capacitor (913) can be arranged at the closest position to the semiconductor chip 903. In other words, the distance between the decoupling capacitor (913) and semiconductor chip 903 is remarkably shortened as compared to the conventional apparatus. As a result, a parasitic inductance is decreased; and therefore, power supply/ground noise is effectively decreased.

Furthermore, the package includes the bonding area 914 and 917 at every side of the die pad 901, so that a large number of conductive lines, extending from the semiconductor chip 903, can be formed and connected to the ground and power supply terminals (G and P). In addition, a large capacity of decoupling capacitor can be formed by controlling the thickness of the high dielectric constant material 913 and/or the dielectric constant value of the plate 913.

Tenth Preferred Embodiment

Figure 21:
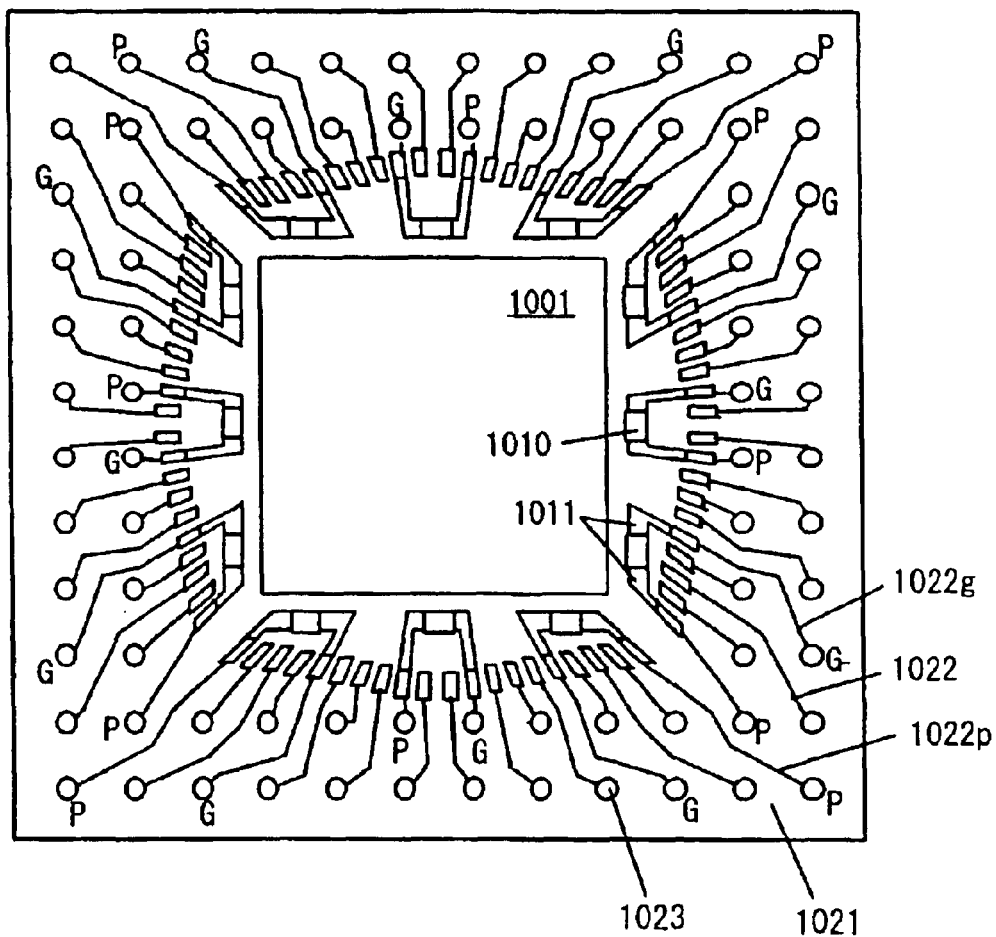
FIG. 21 is a plane view showing an inside of a BGA (Ball Grid Array) type of semiconductor package according to a tenth preferred embodiment of the present invention.
Figure 22:
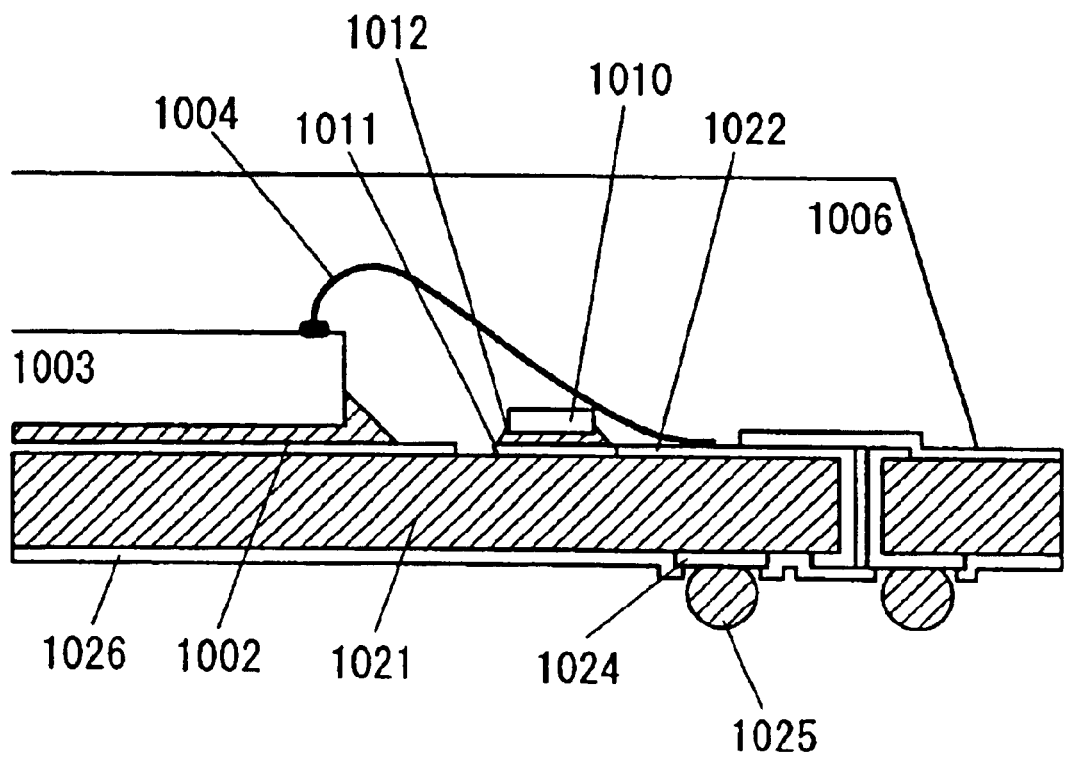
FIG. 22 is a cross-sectional view showing an inside of the semiconductor package, shown in FIG. 21.

FIG. 21 is a plane view showing an inside of a BGA (Ball Grid Array) type of semiconductor package according to a tenth preferred embodiment of the present invention. FIG. 22 is a cross-sectional view showing an inside of the semiconductor package, shown in FIG. 21. In the drawings, "P" represents power supply terminals, and "G" represents ground terminals. This embodiment is an example which applied the first preferred embodiment to the BGA package which uses an organic material board as the base. This embodiment is applicable to a PGA (Pin Grid Array) type of semiconductor apparatus.

In fabrication, a copper layer is formed on a surface of an organic material substrate 1021, and the copper layer is etched to form a conductive pattern (wiring pattern) 1022. The wiring patter 1022 is connected via through holes 1023 to ball mounting pads 1024, formed on the opposite surface of the organic material substrate 1021. A solder resist 1026 is selectively formed on the both surface of the organic material substrate 1021.

A semiconductor chip 1003 is mounted on the organic material substrate 1021 with a conductive paste 1002. Next, surface electrodes of the semiconductor chip 1003 are wire bonded to the wiring pattern 1022 using bonding wires 1004. After that, the upper surface of the organic material substrate 1021 is sealed with a mold resin 1006; and solder balls 1025 are mounted on the ball mounting pads 1024.

In this embodiment, adjacent power supply terminal (P) and ground terminal (G) are extended inwardly to form a chip capacitor mounting pad 1011 at the ends of those extended terminals P and G. A chip capacitor 1010 is mounted on each chip capacitor mounting pad 1011 with a conductive adhesive 1012, such as silver-epoxy system adhesives or solder paste. Surface electrodes on the semiconductor chip 1003 are connected to power-supply terminals, ground terminals and signal terminals using the bonding wires 1004.

The capacity of each of the chip capacitors 1010 is about 0.1 to 1.0 micro F ($\mu$F). Preferably, the number of chip capacitors 1010 or total amount of capacity becomes equivalent for every side of the die pad 1001. In FIG. 21, the number of chip capacitors 1010 is three for each side of the die pad 1001.

As described above, according to the tenth preferred embodiment of the present invention, decoupling capacitors 1010 can be arranged close to the semiconductor chip 1003. In other words, the distance between the decoupling capacitors 1010 and semiconductor chip 1003 is shortened as compared to the conventional apparatus. As a result, a parasitic inductance is decreased; and therefore, power supply/ground noise is effectively decreased.

Eleventh Preferred Embodiment

Figure 23:
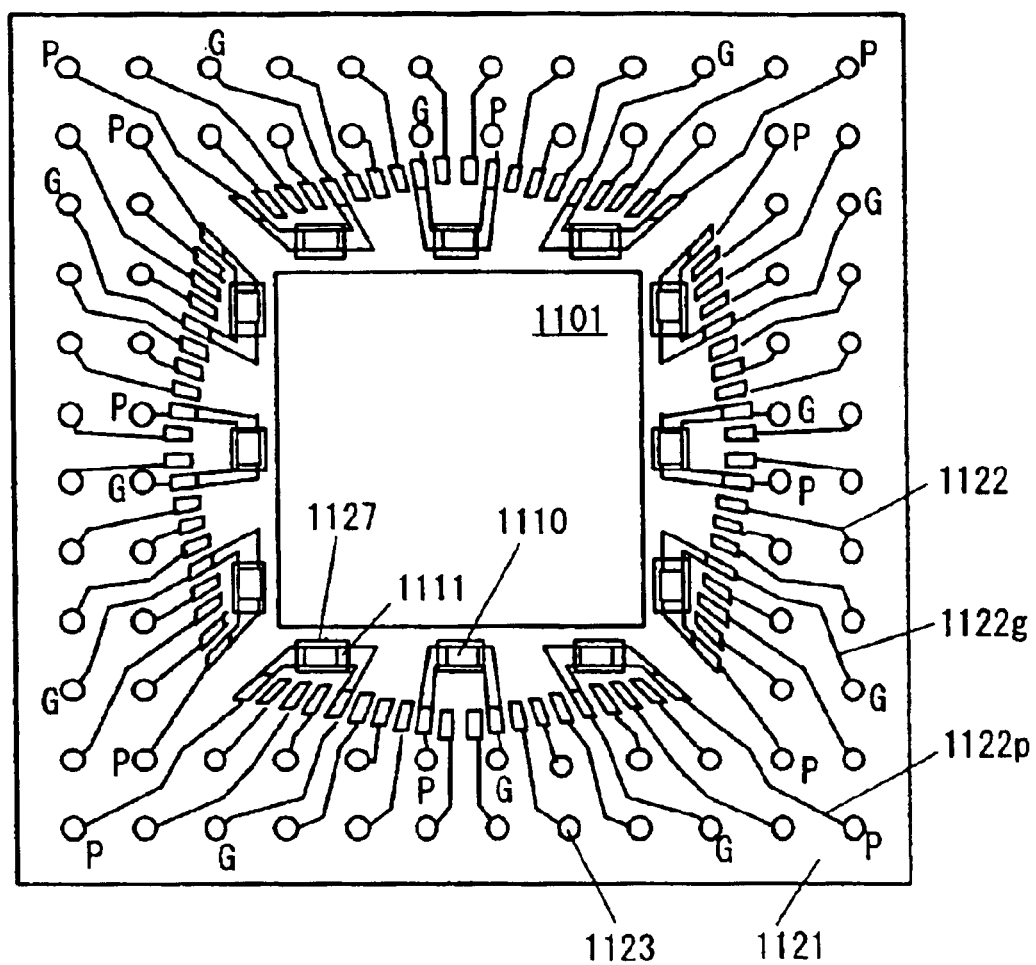
FIG. 23 is a plane view showing an inside of a BGA (Ball Grid Array) type of semiconductor package according to an eleventh preferred embodiment of the present invention.
Figure 24:
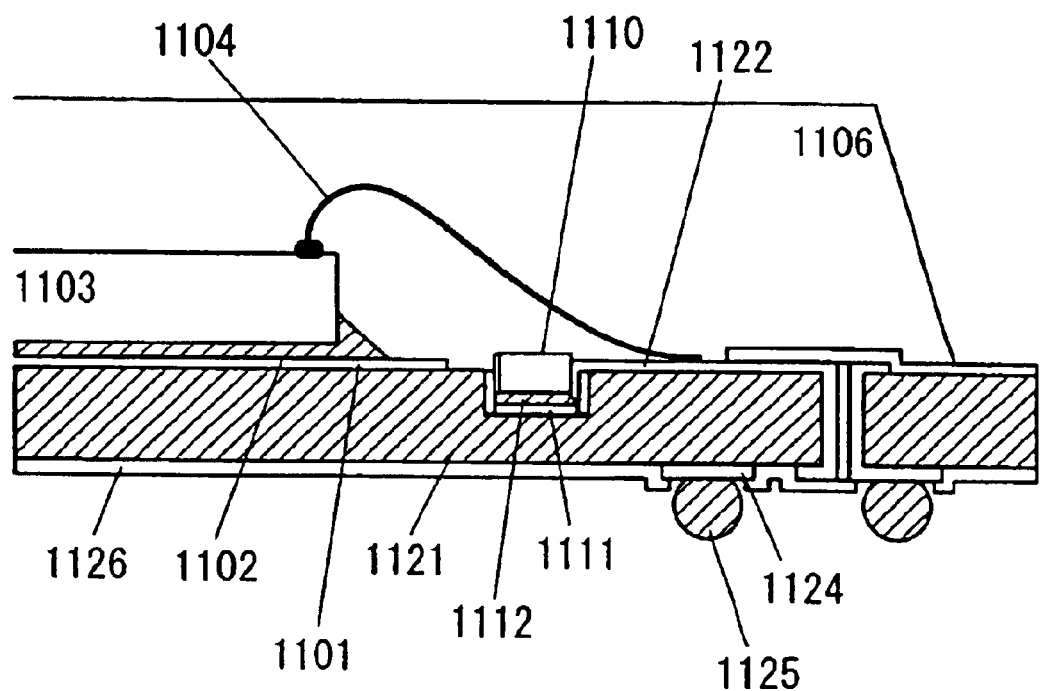
FIG. 24 is a cross-sectional view showing an inside of the semiconductor package, shown in FIG. 23.
Figure 25A:
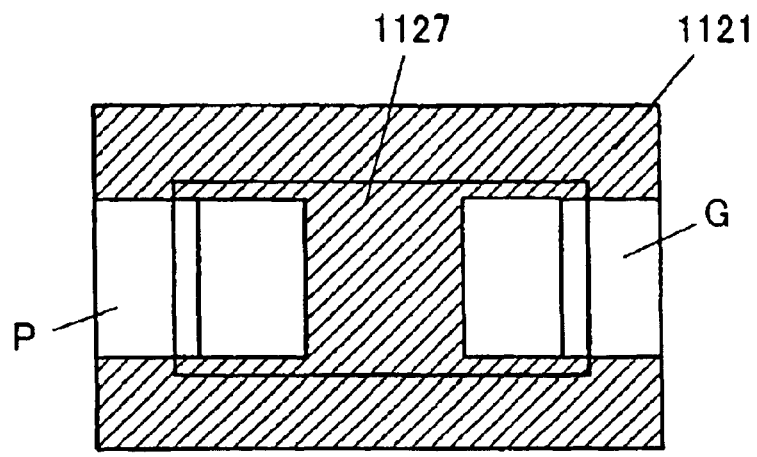
FIG. 25A is a plane view showing a part of the semiconductor package, shown in FIG. 23.
Figure 25B:
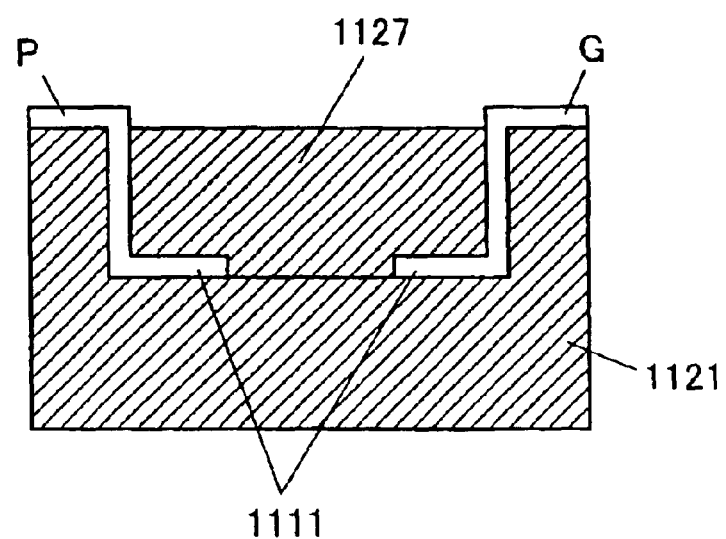
FIG. 25B is a cross-sectional view showing a part of an inside of the semiconductor package, shown in FIG. 23.

FIG. 23 is a plane view showing an inside of a BGA (Ball Grid Array) type of semiconductor package according to an eleventh preferred embodiment of the present invention. FIG. 24 is a cross-sectional, view showing an inside of the semiconductor package, shown in FIG. 23. FIG. 25A is a plane view showing a part of the semiconductor package, shown in FIG. 23. FIG. 25B is a cross-sectional view showing a part of an inside of the semiconductor package, shown in FIG. 23. In the drawings, "P" represents power supply terminals, and "G" represents ground terminals. This embodiment is applicable to a PGA (Pin Grid Array) type of semiconductor apparatus.

A copper layer is formed on a surface of an organic material substrate 1121, and the copper layer is etched to form a conductive pattern (wiring pattern) 1122. The wiring patter 1122 is connected via through holes 1123 to ball mounting pads 1124, formed on the opposite surface of the organic material substrate 1121. A solder resist 1126 is selectively formed on the both surface of the organic material substrate 1121.

A semiconductor chip 1103 is mounted on a die pad 1101, formed on the organic material substrate 1121, with a conductive paste 1102. Surface electrodes of the semiconductor chip 1103 are wire bonded to the wiring pattern 1122 using bonding wires 1104. The upper surface of the organic material substrate 1121 is sealed with a mold resin 1106; and solder balls 1125 are mounted on the ball mounting pads 1124.

The organic material substrate 1121 is provided with cavities 1127 between the die pad 1101 and wiring pattern 1122. The cavities 1127 are formed by a milling process. A chip capacitor mounting pad 1111 is provided at an bottom of each cavity 1127. Each cavity 1127 is provided with a side wall plating. In this embodiment, adjacent power supply terminal (P) and ground terminal (G) are extended inwardly to a corresponding cavity 1127. Such extended terminals (P and G) are connected through the side wall plating in the cavities 1127 to the chip capacitor mounting pad 1111. A chip capacitor 1110 is mounted on each chip capacitor mounting pad 1111 in the cavity 1127 with a conductive adhesive 1112, such as silver-epoxy system adhesives or solder paste. Surface electrodes on the semiconductor chip 1103 are connected to power-supply terminals, ground terminals and signal terminals via the bonding wires 1104.

The capacity of each of the chip capacitors 1110 is about 0.1 to 1.0 micro F ($\mu$F). Preferably, the number of chip capacitors 1110 or total amount of capacity becomes equivalent for every side of the die pad 1101. In FIG. 23, the number of chip capacitors 1110 is three for each side of the die pad 1101.

As described above, according to the eleventh preferred embodiment of the present invention, decoupling capacitors 1110 can be arranged close to the semiconductor chip 1103. In other words, the distance between the decoupling capacitors 1110 and semiconductor chip 1103 is shortened as compared to the conventional apparatus. As a result, a parasitic inductance is decreased; and therefore, power supply/ground noise is effectively decreased.

Further, according to the eleventh preferred embodiment, the chip capacitors 1110 are mounted in the cavities 1127, therefore, it can be prevented that a short circuit is generated between the chip capacitors 1110 and bonding wires 1104.

Twelfth Preferred Embodiment

Figure 26:
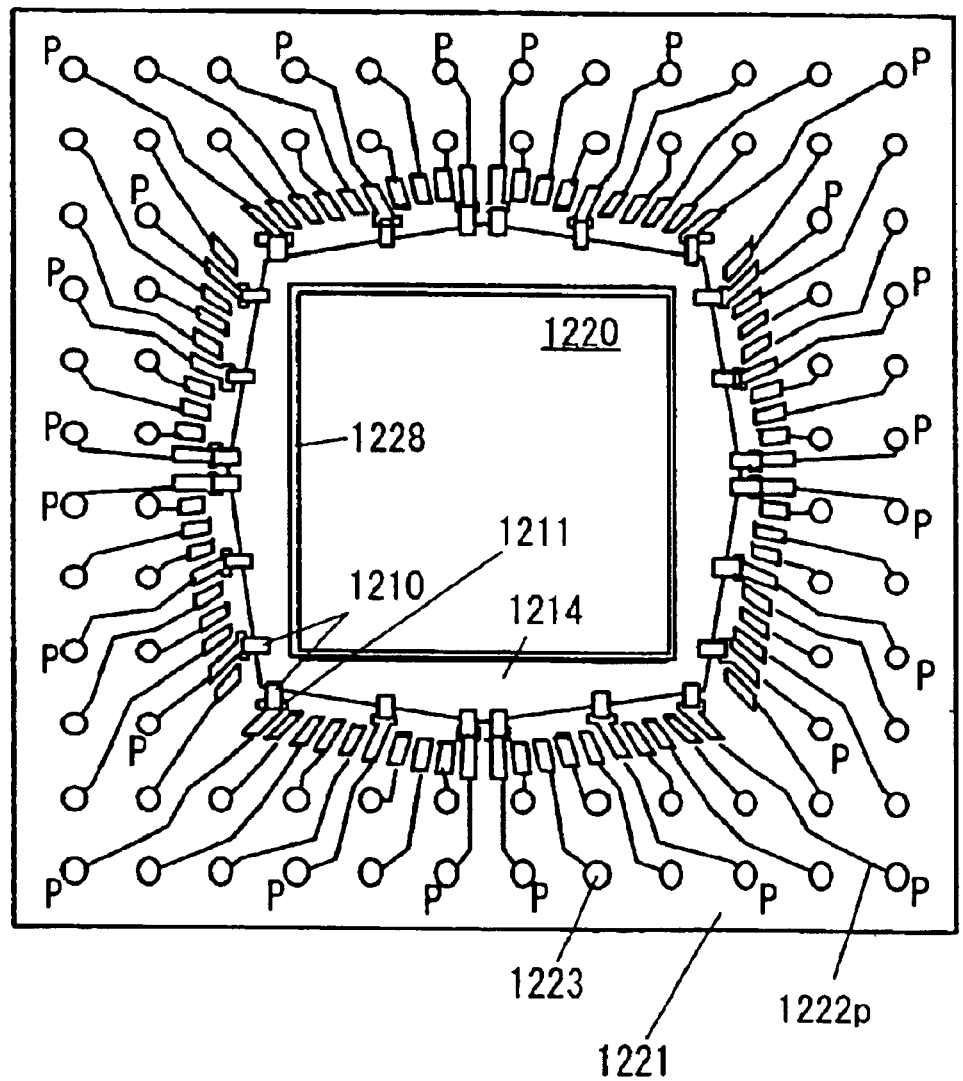
FIG. 26 is a plane view showing an inside of a BGA (Ball Grid Array) type of semiconductor package according to a twelfth preferred embodiment of the present invention.
Figure 27A:
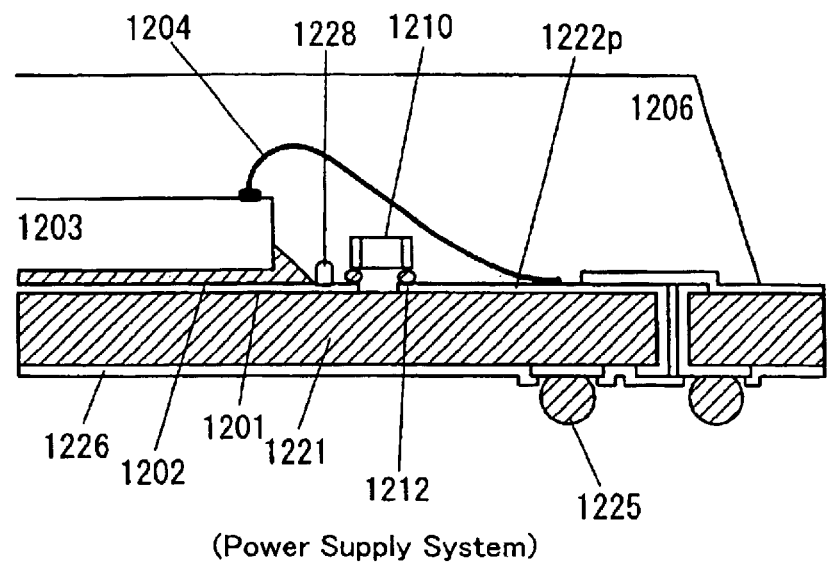
FIG. 27A is a cross-sectional view showing an inside of the semiconductor package, shown in FIG. 26.
Figure 27B:
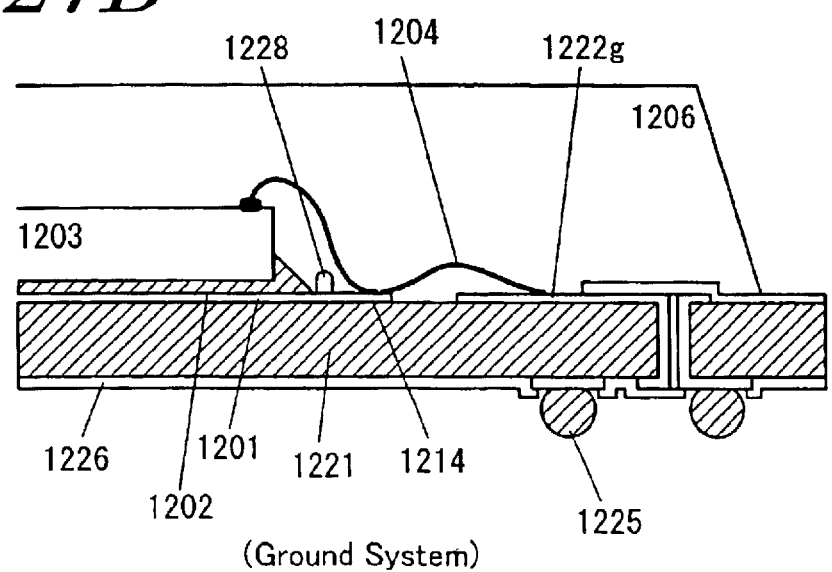
FIG. 27B is a cross-sectional view showing an inside of the semiconductor package, shown in FIG. 26.

FIG. 26 is a plane view showing an inside of a BGA (Ball Grid Array) type of semiconductor package according to a twelfth preferred embodiment of the present invention. FIGS. 27A and 27B are cross-sectional views showing an inside of the semiconductor package, shown in FIG. 26. This embodiment corresponds to the above-described third preferred embodiment. In the drawings, "P" represents power supply terminals, and "G" represents ground terminals. This embodiment is applicable to a PGA (Pin Grid Array) type of semiconductor apparatus.

A copper layer is formed on a surface of an organic material substrate 1221, and the copper layer is etched to form a conductive pattern (wiring pattern) 1222. The wiring patter 1222 is connected via through holes 1223 to ball mounting pads 1224, formed on the opposite surface of the organic material substrate 1221. A solder resist 1226 is selectively formed on the both surface of the organic material substrate 1221.

A semiconductor chip 1203 is mounted on a die pad 1201, formed on the organic material substrate 1221, with a conductive paste 1202. Surface electrodes of the semiconductor chip 1203 are wire bonded to the wiring pattern 1222 using bonding wires 1204. The upper surface of the organic material substrate 1221 is sealed with a mold resin 1206; and solder balls 1225 are mounted on the ball mounting pads 1224.

The die pad 1201 extend outwardly to form a ground bonding area 1214. Chip capacitors 1210 are provided between the ground bonding area 1214 and power supply terminals "P" with a conductive adhesive 1212, such as silver-epoxy system adhesives or solder paste. As shown in FIG. 27A, surface electrodes for power supply on the semiconductor chip 1203 are connected to power-supply terminals "P" with the bonding wires 1204. On the other hand, as shown in FIG. 27B, surface electrodes for ground on the semiconductor chip 1203 are connected via the ground bonding area 1214 to the ground terminals "G" with the bonding wires 1204.

The die pad 1201 is provided at the surface with a projection or ridge 1228 surrounding a chip mounting area 1220, so that the conductive paste 1202 is prevented from being leaked out toward the bonding area 1214. The projection 1228 is of a solder resist (1226) and is shaped to have a height of 0.05 to 0.2 mm.

The capacity of each of the chip capacitors 1210 is about 0.1 to 1.0 micro F ($\mu$F). Preferably, the number of chip capacitors 1210 or total amount of capacity becomes equivalent for every side of the die pad 1201. In FIG. 26, the number of chip capacitors 1210 is three for each side of the die pad 1201.

As described above, according to the twelfth preferred embodiment of the present invention, decoupling capacitors 1210 can be arranged close to the semiconductor chip 1203. In other words, the distance between the decoupling capacitors 1210 and semiconductor chip 1203 is shortened as compared to the conventional apparatus. As a result, a parasitic inductance is decreased; and therefore, power supply/ground noise is effectively decreased.

Further, according to the twelfth preferred embodiment, the surface electrodes for ground of the semiconductor chip 1203 are connected via the bonding area 1214 to the ground terminals "G". In other words, the surface electrodes for ground of the semiconductor chip 1203 are not connected directly to the ground terminals "G" with the bonding wires 1204. Therefore, the surface electrodes for ground can be arranged on the semiconductor chip 1203 regardless the location of the ground terminals "G". Further more, the ground bonding are 1214 is formed to surround the die pad 1201, so that a large number of ground wiring lines can be provided.

Thirteenth Preferred Embodiment

Figure 28:
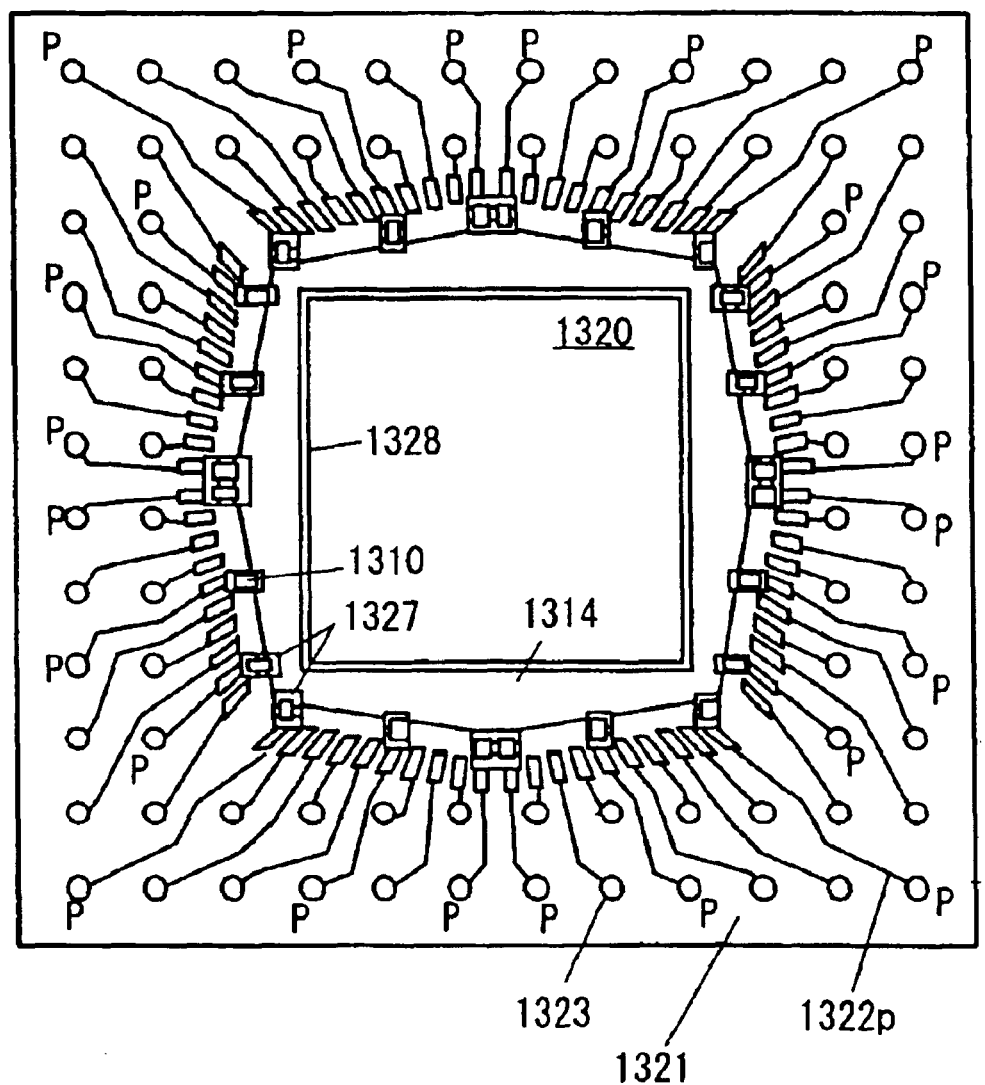
FIG. 28 is a plane view showing an inside of a BGA (Ball Grid Array) type of semiconductor package according to a thirteenth preferred embodiment of the present invention.
Figure 29A:
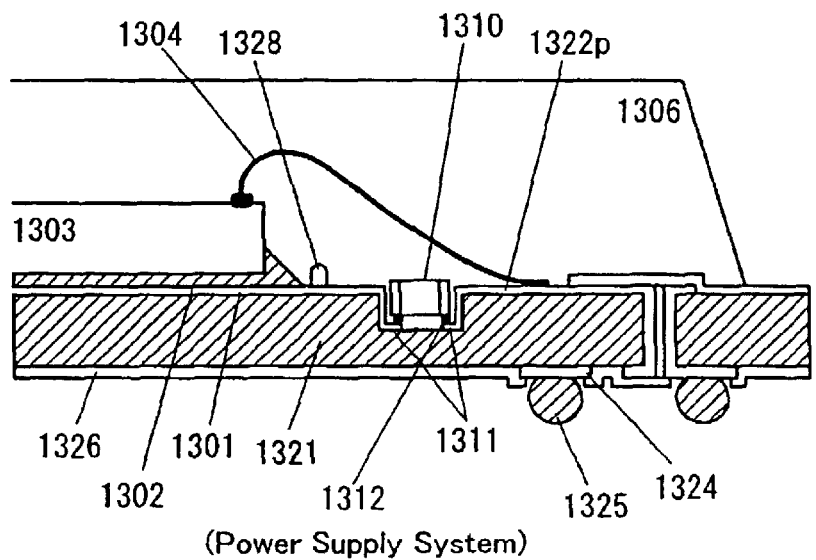
FIG. 29A is a cross-sectional view showing an inside of the semiconductor package, shown in FIG. 28.
Figure 29B:
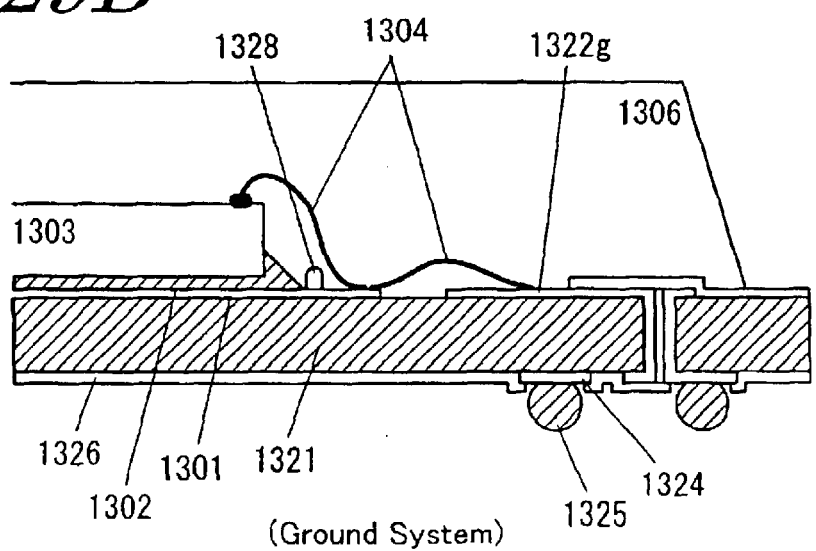
FIG. 29B is a cross-sectional view showing an inside of the semiconductor package, shown in FIG. 28.

FIG. 28 is a plane view showing an inside of a BGA (Ball Grid Array) type of semiconductor package according to a thirteenth preferred embodiment of the present invention. FIGS. 29A and 29B are cross-sectional views showing an inside of the semiconductor package, shown in FIG. 28. This embodiment is formed by combining the features of the eleventh and twelfth preferred embodiments. In the drawings, "P" represents power supply terminals, and "G" represents ground terminals. This embodiment is applicable to a PGA (Pin Grid Array) type of semiconductor apparatus.

A copper layer is formed on a surface of an organic material substrate 1321, and the copper layer is etched to form a conductive pattern (wiring pattern) 1322. The wiring patter 1322 is connected via through holes 1323 to ball mounting pads 1324, formed on the opposite surface of the organic material substrate 1321. A solder resist 1326 is selectively formed on the both surface of the organic material substrate 1321.

A semiconductor chip 1303 is mounted on a die pad 1301, formed on the organic material substrate 1321, with a conductive paste 1302. Surface electrodes of the semiconductor chip 1303 are wire bonded to the wiring pattern 1322 using bonding wires 1304. The upper surface of the organic material substrate 1321 is sealed with a mold resin 1306; and solder balls 1325 are mounted on the ball mounting pads 1324.

The die pad 1301 extends outwardly to form a ground bonding area 1314. The organic material substrate 1321 is provided with cavities 1327 between the die pad 1301 and wiring pattern 1322. The cavities 1327 are formed by a milling process. A chip capacitor mounting pad 1311 is provided at a bottom of each cavity 1327. Each cavity 1327 is provided with a sidewall plating. A chip capacitor 1310 is mounted on each chip capacitor mounting pad 1311 in the cavity 1327 with a conductive adhesive 1312, such as silver-epoxy system adhesives or solder paste.

As shown in FIG. 29A, surface electrodes for power supply on the semiconductor chip 1303 are connected to power-supply terminals "P" with the bonding wires 1304. On the other hand, as shown in FIG. 29B, surface electrodes for ground on the semiconductor chip 1303 are connected via the ground bonding area 1314 to the ground terminals "G" with the bonding wires 1304.

The die pad 1301 is provided at the surface with a projection or ridge 1328 surrounding a chip mounting area 1320, so that the conductive paste 1302 is prevented from being leaked out toward the bonding area 1314. The projection 1328 is of a solder resist (1326) and is shaped to have a height of 0.05 to 0.2 mm.

The capacity of each of the chip capacitors 1310 is about 0.1 to 1.0 micro F ($\mu$F). Preferably, the number of chip capacitors 1310 or total amount of capacity becomes equivalent for every side of the die pad 1301. In FIG. 28, the number of chip capacitors 1310 is six for each side of the die pad 1301.

As described above, according to the thirteenth preferred embodiment of the present invention, decoupling capacitors 1310 can be arranged close to the semiconductor chip 1303.

In other words, the distance between the decoupling capacitors 1310 and semiconductor chip 1303 is shortened as compared to the conventional apparatus. As a result, a parasitic inductance is decreased; and therefore, power supply/ground noise is effectively decreased.

Further, according to the thirteenth preferred embodiment, the surface electrodes for ground of the semiconductor chip 1303 are connected via the bonding area 1314 to the ground terminals "G". In other words, the surface electrodes for ground of the semiconductor chip 1303 are not connected directly to the ground terminals "G" with the bonding wires 1304. Therefore, the surface electrodes for ground can be arranged on the semiconductor chip 1303 regardless the location of the ground terminals "G". Further more, the ground bonding area 1314 is formed to surround the die pad 1301, so that a large number of ground wiring lines can be provided.

Furthermore, according to the thirteenth preferred embodiment, the chip capacitors 1310 are mounted in the cavities 1327, therefore, it can be prevented that a short circuit is generated between the chip capacitors 1310 and bonding wires 1304.

Fourteenth Preferred Embodiment

Figure 30:
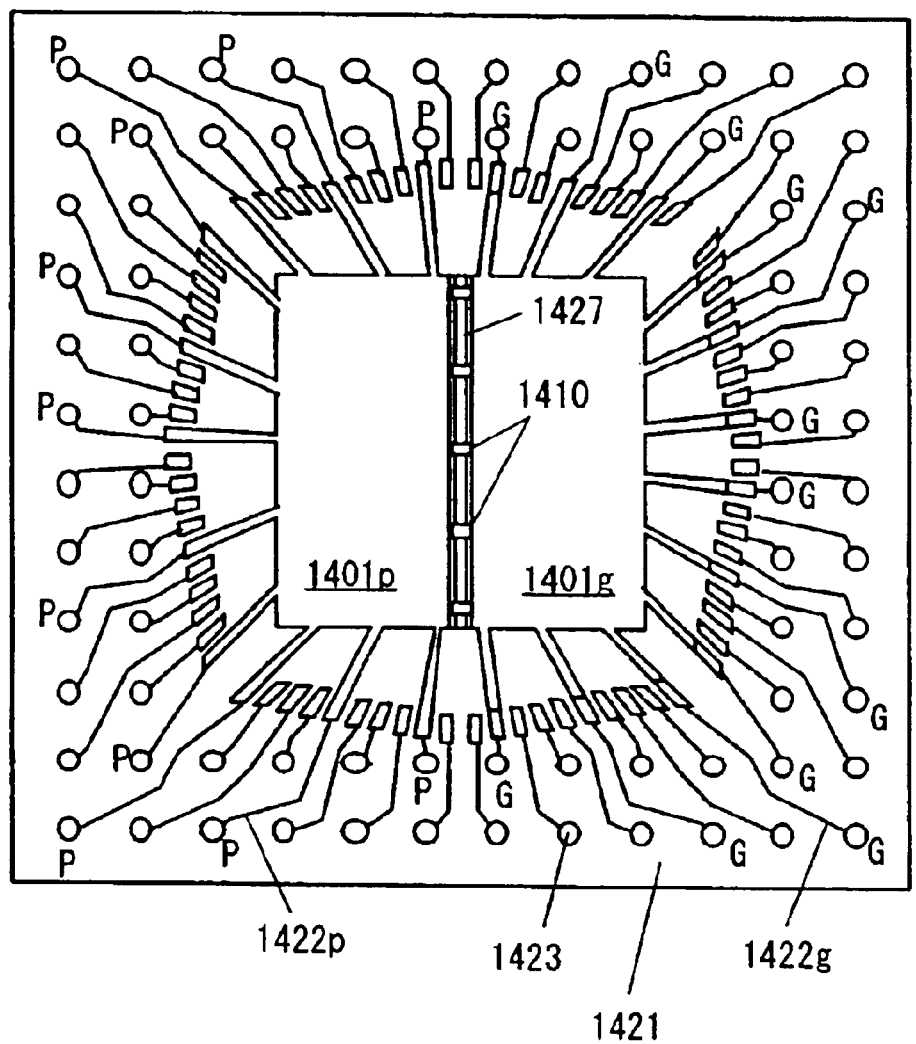
FIG. 30 is a plane view showing an inside of a BGA (Ball Grid Array) type of semiconductor package according to a fourteenth preferred embodiment of the present invention.
Figure 31:
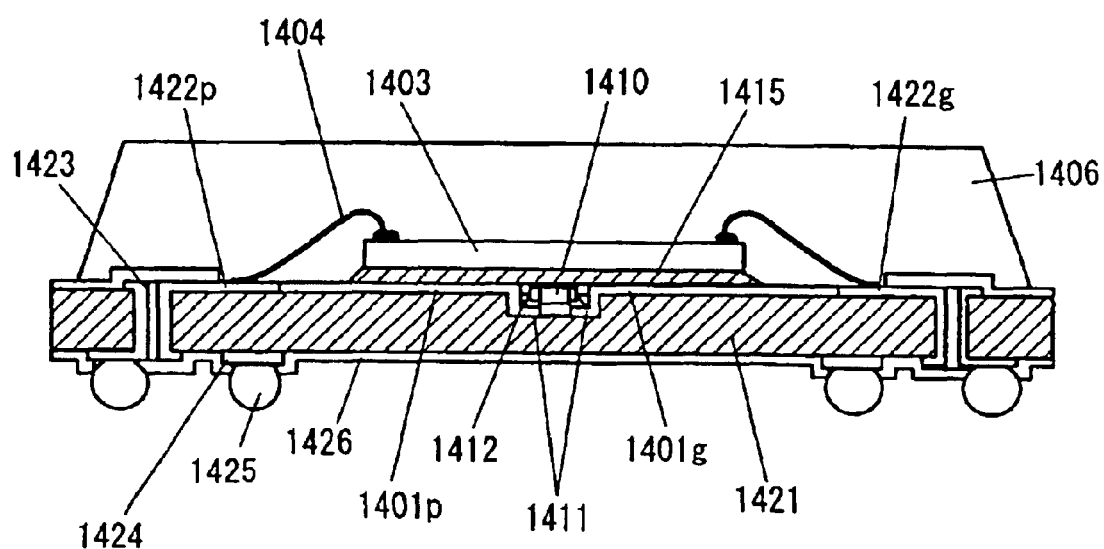
FIG. 31 is a cross-sectional view showing an inside of the semiconductor package, shown in FIG. 30.

FIG. 30 is a plane view showing an inside of a BGA (Ball Grid Array) type of semiconductor package according to a fourteenth preferred embodiment of the present invention. FIG. 31 is a cross-sectional view showing an inside of the semiconductor package, shown in FIG. 30. This embodiment is formed by applying the above described fourth preferred embodiment to a BGA type of semiconductor package. In the drawings, "P" represents power supply terminals, and "G" represents ground terminals. This embodiment is applicable to a PGA (Pin Grid Array) type of semiconductor apparatus.

A copper layer is formed on a surface of an organic material substrate 1421, and the copper layer is etched to form a conductive pattern (wiring pattern) 1422. The wiring patter 1422 is connected via through holes 1423 to ball mounting pads 1424, formed on the opposite surface of the organic material substrate 1421. A solder resist 1426 is selectively formed on the both surface of the organic material substrate 1421.

A semiconductor chip 1403 is mounted on a die pad 1401, formed on the organic material substrate 1421, with an insulating adhesive 1415 in paste state or sheet shape. Surface electrodes of the semiconductor chip 1403 are wire bonded to the wiring pattern 1422 using bonding wires 1404. The upper surface of the organic material substrate 1421 is sealed with a mold resin 1406; and solder balls 1425 are mounted on the ball mounting pads 1424.

The die pad 1401 is divided into a half, one die pad 1401*p* is united or integrated with power supply terminals (P), and the other die pad 1401*g* is united or integrated with ground terminals (G). At the boundary between the die pads 1401*p* and 1401*g*, a cavity or groove 1427 is formed. The cavity 1427 is formed by a milling process. A chip capacitor mounting pad 1411 is provided at a bottom of the cavity 1427. The cavity 1427 is provided with a sidewall plating. Chip capacitors 1410 are mounted on the chip capacitor mounting pad 1411 in the cavity 1427 with a conductive adhesive 1412, such as silver-epoxy system adhesives or solder paste.

In this embodiment, the semiconductor chip 1403 is mounted on the divided die pads 1401*p* and 1401*g* with the insulating adhesive 1415, or the die pads 1401*p* and 1401*g* are coated with the solder resist 1426 in advance. The capacity of each of the chip capacitors 1410 is about 0.1 to 1.0 micro F ($\mu$F).

As described above, according to the fourteenth preferred embodiment of the present invention, decoupling capacitors 1410 can be arranged close to the semiconductor chip 1403. In other words, the distance between the decoupling capacitors 1410 and semiconductor chip 1403 is shortened as compared to the conventional apparatus. As a result, a parasitic inductance is decreased; and therefore, power supply/ground noise is effectively decreased.

Furthermore, since the area in which the chip capacitors 1410 is mounted is large, as compared with the above-described twelfth preferred embodiment. Therefore, the chip capacitors 1410 can be arranged or set up easily.

Fifteenth Preferred Embodiment

Figure 32:
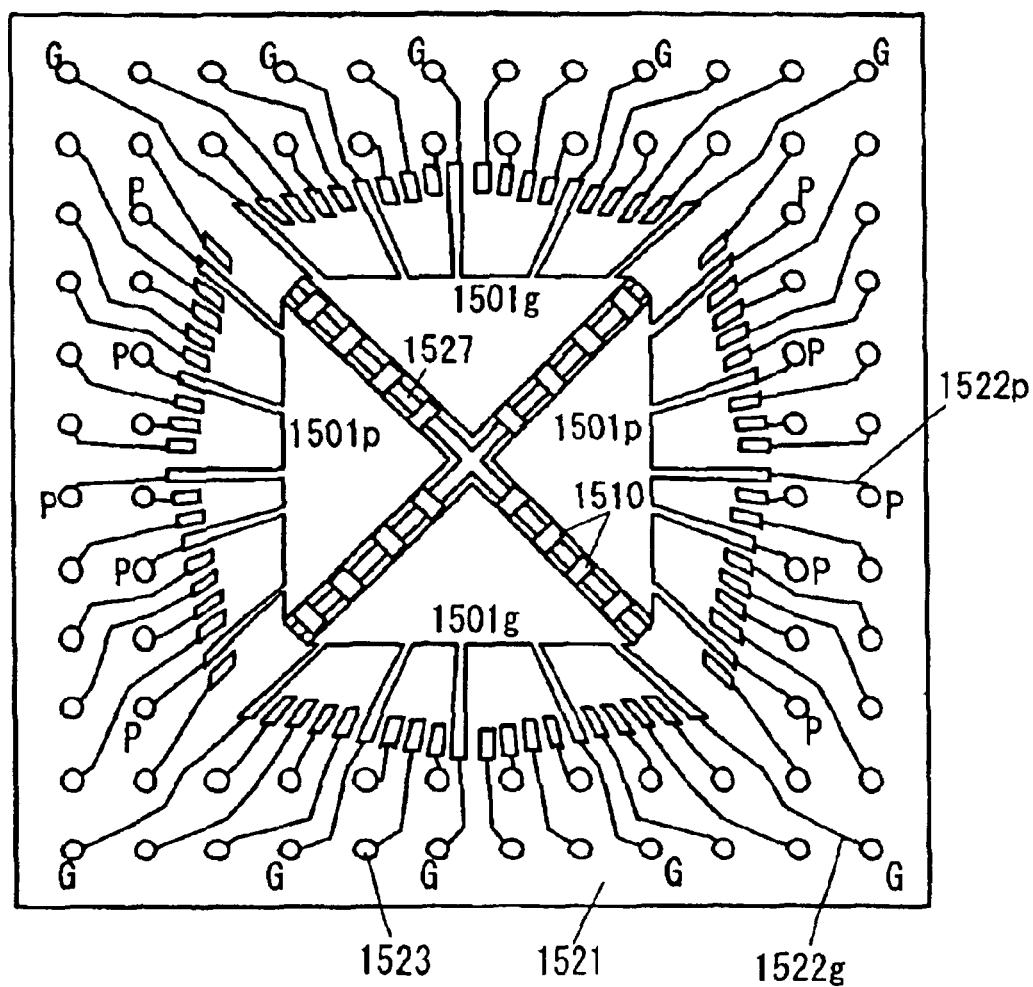
FIG. 32 is a plane view showing an inside of a BGA (Ball Grid Array) type of semiconductor package according to a fifteenth preferred embodiment of the present invention.
Figure 33:
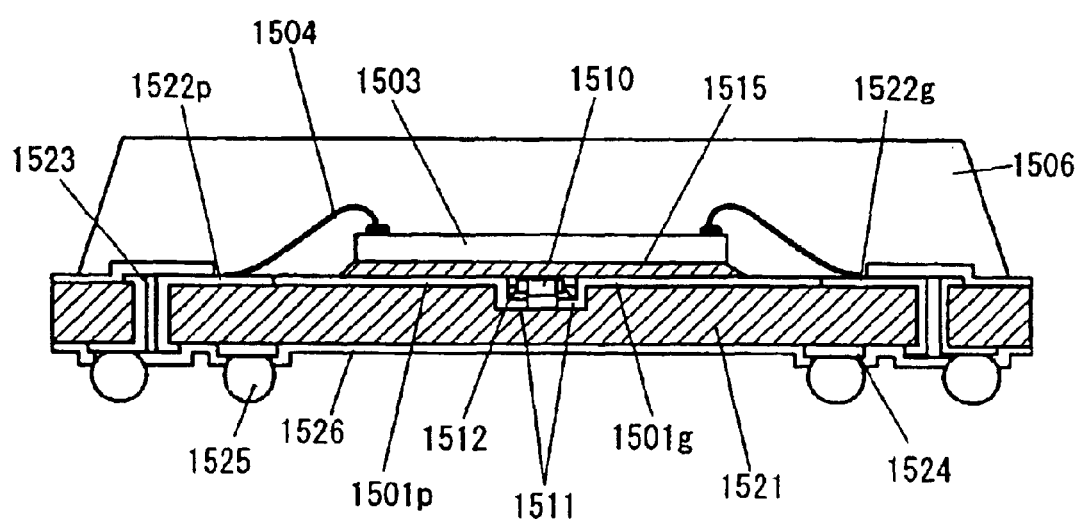
FIG. 33 is a cross-sectional view showing an inside of the semiconductor package, shown in FIG. 32.

FIG. 32 is a plane view showing an inside of a BGA (Ball Grid Array) type of semiconductor package according to a fifteenth preferred embodiment of the present invention. FIG. 33 is a cross-sectional view showing an inside of the semiconductor package, shown in FIG. 32. This embodiment is formed by applying the above described fifth preferred embodiment to a BGA type of semiconductor package. In the drawings, "P" represents power supply terminals, and "G" represents ground terminals. This embodiment is applicable to a PGA (Pin Grid Array) type of semiconductor apparatus.

A copper layer is formed on a surface of an organic material substrate 1521, and the copper layer is etched to form a conductive pattern (wiring pattern) 1522. The wiring patter 1522 is connected via through holes 1523 to ball mounting pads 1524, formed on the opposite surface of the organic material substrate 1521. A solder resist 1526 is selectively formed on the both surface of the organic material substrate 1521.

A semiconductor chip 1503 is mounted on a die pad 1501, formed on the organic material substrate 1521, with an insulating adhesive 1515 in paste state or sheet shape. Surface electrodes of the semiconductor chip 1503 are wire bonded to the wiring pattern 1522 using bonding wires 1504. The upper surface of the organic material substrate 1521 is sealed with a mold resin 1506; and solder balls 1525 are mounted on the ball mounting pads 1524.

The die pad 1501 is divided into four pieces (1501*p* and 1501*g*). The die pads 1501*p* are united or integrated with power supply terminals P, while the die pads 1501*g* are united or integrated with the ground terminals (G). At the boundaries between adjacent two die pads 1501*p* and 1501*g*, a cavity or groove 1527 is formed in the organic material substrate 1521. The cavity 1527 is formed by a milling process to be a cross-shape along the diagonal lines of the die pad 1501. A chip capacitor mounting pad 1511 is provided at a bottom of the cavity 1527. The cavity 1527 is provided with a sidewall plating. Chip capacitors 1510 are mounted on the chip capacitor mounting pad 1511 in the cavity 1527 with a conductive adhesive 1512, such as silver-epoxy system adhesives or solder paste. Those die pads 1501*p* and 1501*g* are arranged by turns. The die pad 1501 can be divided not only by four but also by other even number, such as six and eight.

In this embodiment, the semiconductor chip 1503 is mounted on the divided die pads 1501*p* and 1501*g* with the insulating adhesive 1515, or the die pads 1501*p* and 1501*g* are coated with the solder resist 1526 in advance. The capacity of each of the chip capacitors 1510 is about 0.1 to 1.0 micro F ($\mu$F).

As described above, a die pad is divided into four or more, and die pads 1501*p* are made into power supply potential by uniting with the power supply terminals (P), and the die pads 1501*g* of the other side be ground potential by uniting with the ground terminals (G). The chip capacitors 1510 arranged between divided die pads 1501p and 1501g using the conductive adhesives 1512, such as silver-epoxy system adhesives or solder paste. Therefore, decoupling capacitors 1510 can be arranged close to the semiconductor chip 1503. In other words, the distance between the decoupling capacitors 1510 and semiconductor chip 1503 is shortened as compared to the conventional apparatus. As a result, a parasitic inductance is decreased; and therefore, power supply/ground noise is effectively decreased.

Furthermore, when the die pad is divided into more number, more chip capacitors 1510 can be used.

Sixteenth Preferred Embodiment

Figure 34:
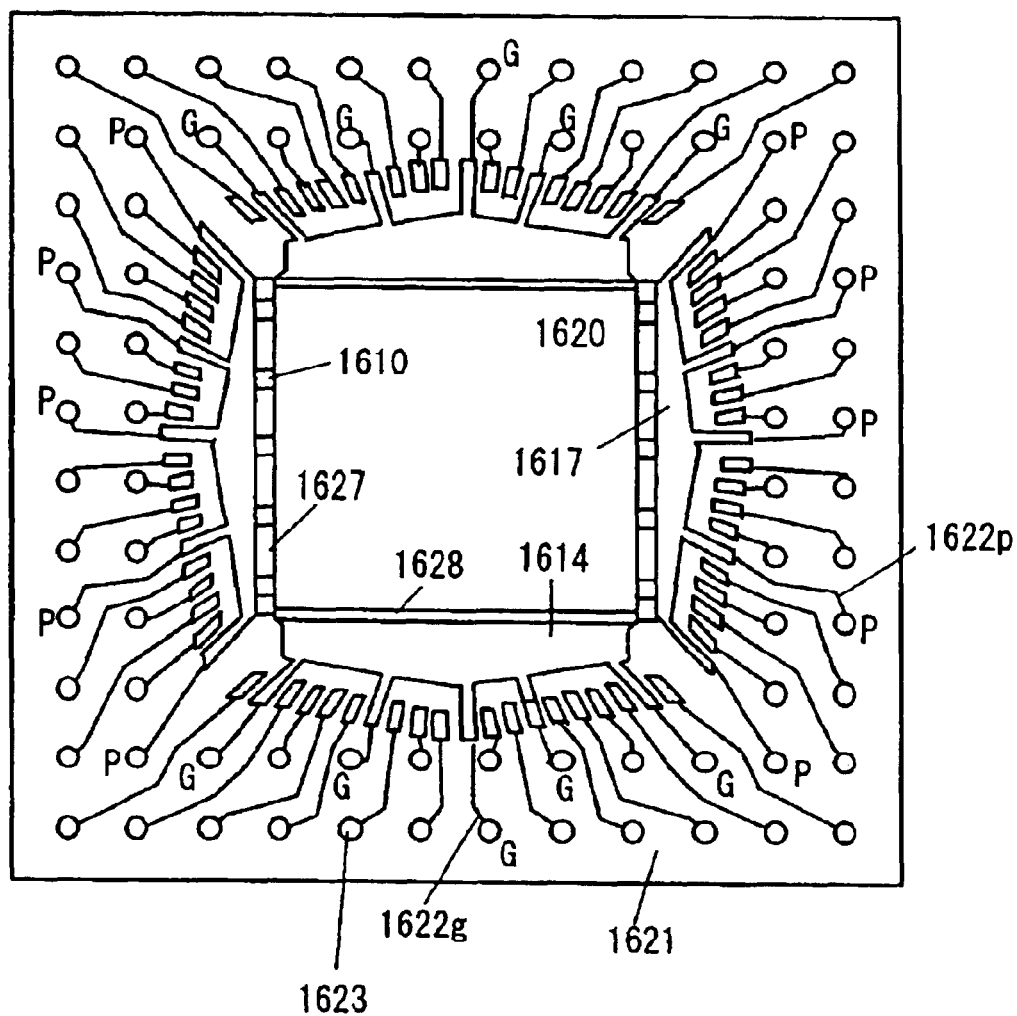
FIG. 34 is a plane view showing an inside of a BGA (Ball Grid Array) type of semiconductor package according to a sixteenth preferred embodiment of the present invention.
Figure 35A:
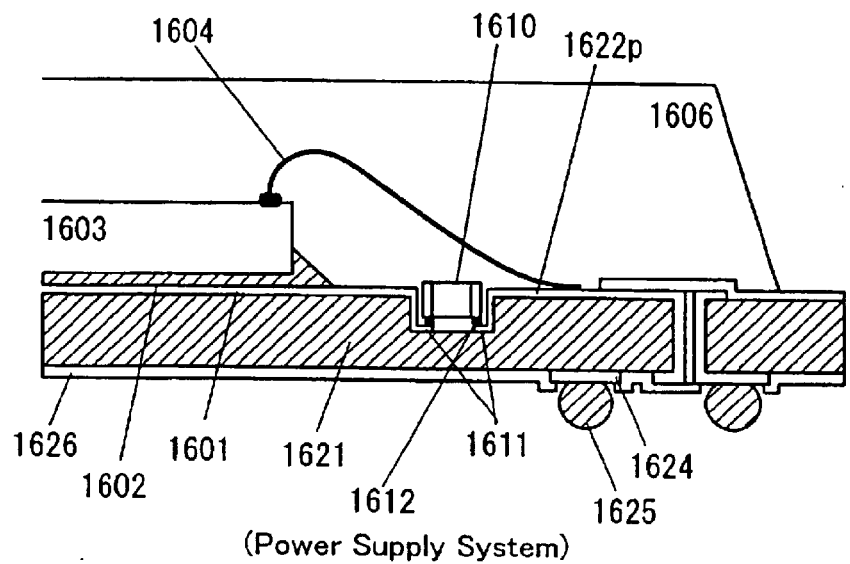
FIG. 35A is a cross-sectional view showing an inside of the semiconductor package, shown in FIG. 34.
Figure 35B:
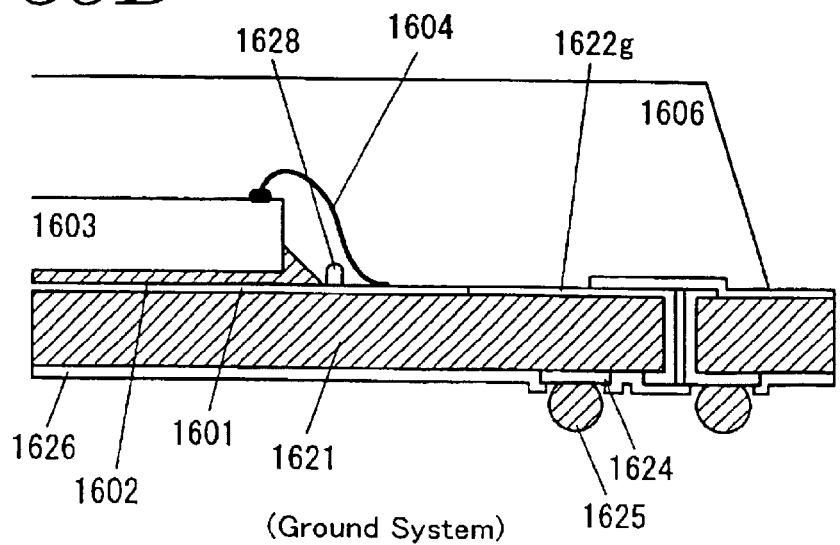
FIG. 35B is a cross-sectional view showing an inside of the semiconductor package, shown in FIG. 34.

FIG. 34 is a plane view showing an inside of a BGA (Ball Grid Array) type of semiconductor package according to a sixteenth preferred embodiment of the present invention. FIGS. 35A and 35B are cross-sectional views showing an inside of the semiconductor package, shown in FIG. 34. This embodiment is formed by applying the above described sixth preferred embodiment to a BGA type of semiconductor package. In the drawings, "P" represents power supply terminals, and "G" represents ground terminals. This embodiment is applicable to a PGA (Pin Grid Array) type of semiconductor apparatus.

According to this embodiment, a copper layer is formed on a surface of an organic material substrate 1621, and the copper layer is etched to form a conductive pattern (wiring pattern) 1622. The wiring patter 1622 is connected via through holes 1623 to ball mounting pads 1624, formed on the opposite surface of the organic material substrate 1621. A solder resist 1626 is selectively formed on the both surface of the organic material substrate 1621.

A semiconductor chip 1603 is mounted on a die pad 1601, formed on the organic material substrate 1621, with a conductive paste 1602. Surface electrodes of the semiconductor chip 1603 are wire bonded to the wiring pattern 1622 using bonding wires 1604. The upper surface of the organic material substrate 1621 is sealed with a mold resin 1606; and solder balls 1625 are mounted on the ball mounting pads 1624.

The die pad 1601 is extended outwardly to form ground bonding areas 1614 at the opposite two sides. The ground bonding areas 1614 are formed to be an integral body with the wiring pattern 1622g for ground terminals. The structure further includes power supply bonding areas 1617 at the other two opposite sides of the die pad 1601. The power supply bonding areas 1617 are formed to be an integral body with the wiring pattern 1622p for power supply terminals P. The power supply bonding areas 1617 are formed at the sides where the ground bonding areas 1614 are not formed.

The organic material substrate 1621 is provided with two cavities or grooves 1627 formed between a chip mounting area 1620 and the power supply bonding area 1617. The cavities 1627 are extended along the two opposite sides of the die pad 1601. The cavities 1627 are formed by a milling process. A chip capacitor mounting pad 1611 is provided at a bottom of each cavity 1627. Each cavity 1627 is provided with a sidewall plating. Chip capacitors 1610 are mounted on the chip capacitor mounting pads 1611 in the cavities 1627 with a conductive adhesive 1612, such as silver-epoxy system adhesives or solder paste.

The die pad 1601 is provided at the surface with projections or ridges 1628, which extend along the two opposite sides of the die pad 1601. The projections 1628 defines a chip mounting area 1620 and the ground bonding areas 1614 so that the conductive paste 1602 is prevented from being leaked out toward the bonding areas 1614. The projections 1628 are of a solder resist (1626) and is shaped to have a height of 0.05 to 0.2 mm.

As shown in FIG. 35A, surface electrodes for power supply on the semiconductor chip 1603 are connected to power-supply terminals (1622p) with the bonding wires 1604. On the other hand, as shown in FIG. 35B, surface electrodes for ground on the semiconductor chip 1603 are connected to the ground bonding areas 1614, united with the ground terminals (1622g), with the bonding wires 1604.

The capacity of each of the chip capacitors 1610 is about 0.1 to 1.0 micro F ($\mu$F). Preferably, the number of chip capacitors 1610 or total amount of capacity becomes equivalent for each side of the die pad 1601. In FIG. 34, the number of chip capacitors 1610 is five for each of the two opposite sides of the die pad 1601.

As described above, according to the sixteenth preferred embodiment of the present invention, decoupling capacitors 1610 can be arranged close to the semiconductor chip 1603. In other words, the distance between the decoupling capacitors 1610 and semiconductor chip 1603 is shortened as compared to the conventional apparatus. As a result, a parasitic inductance is decreased; and therefore, power supply/ground noise is effectively decreased.

Further, the ground bonding areas 1614 are formed, so that a large number of ground wiring lines can be provided. Furthermore, according to the sixteenth preferred embodiment, the chip capacitors 1610 are mounted in the cavities 1627, therefore, it can be prevented that a short circuit is generated between the chip capacitors 1610 and bonding wires 1604.

Seventeenth Preferred Embodiment

Figure 36:
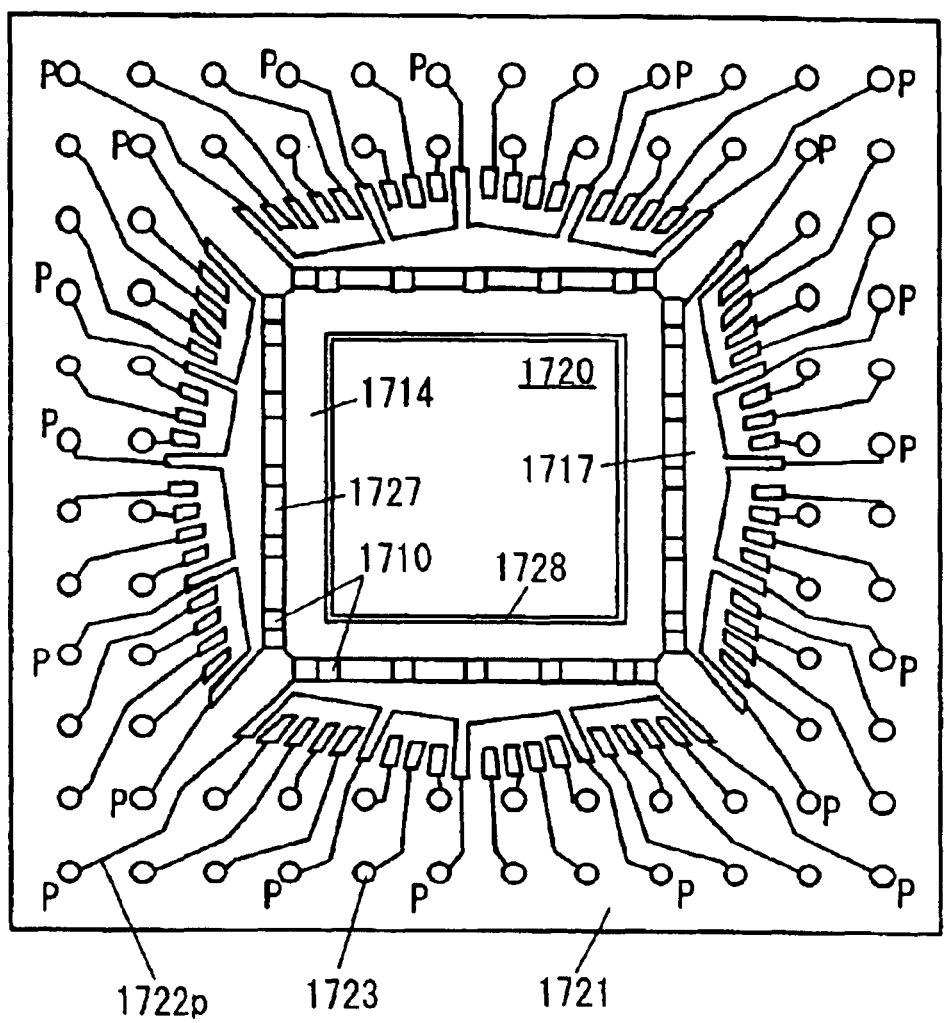
FIG. 36 is a plane view showing an inside of a BGA (Ball Grid Array) type of semiconductor package according to a seventeenth preferred embodiment of the present invention.
Figure 37A:
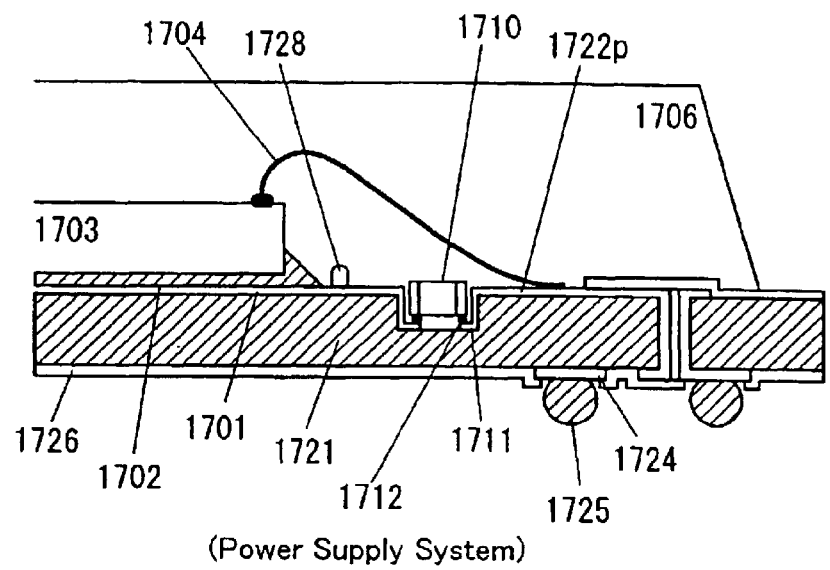
FIG. 37A is a cross-sectional view showing an inside of the semiconductor package, shown in FIG. 36.
Figure 37B:
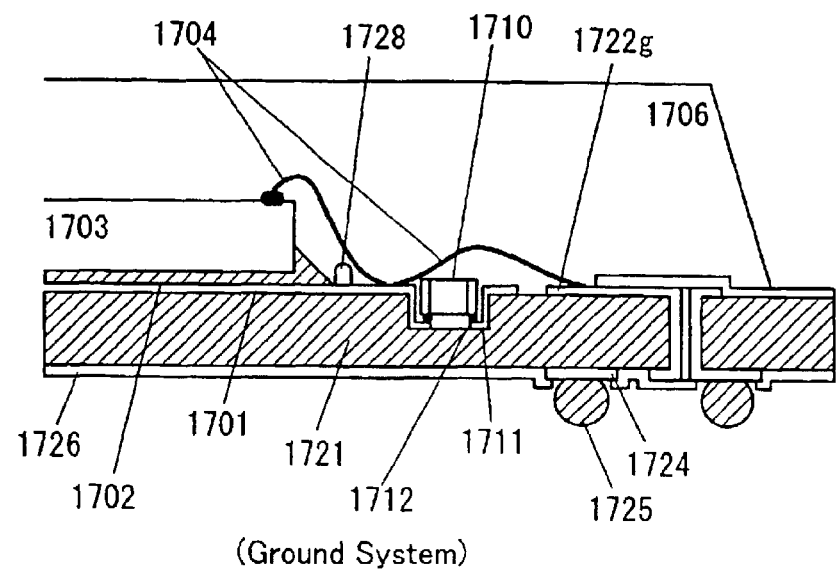
FIG. 37B is a cross-sectional view showing an inside of the semiconductor package, shown in FIG. 36.

FIG. 36 is a plane view showing an inside of a BGA (Ball Grid Array) type of semiconductor package according to a seventeenth preferred embodiment of the present invention. FIGS. 37A and 37B are cross-sectional views showing an inside of the semiconductor package, shown in FIG. 36. This embodiment is formed by applying the above described seventh preferred embodiment to a BGA type of semiconductor package. In the drawings, "P" represents power supply terminals, and "G" represents ground terminals. This embodiment is applicable to a PGA (Pin Grid Array) type of semiconductor apparatus.

According to this embodiment, a copper layer is formed on a surface of an organic material substrate 1721, and the copper layer is etched to form a conductive pattern (wiring pattern) 1722. The wiring patter 1722 is connected via through holes 1723 to ball mounting pads 1724, formed on the opposite surface of the organic material substrate 1721. A solder resist 1726 is selectively formed on the both surface of the organic material substrate 1721.

A semiconductor chip 1703 is mounted on a die pad 1701, formed on the organic material substrate 1721, with a conductive paste 1702. Surface electrodes of the semiconductor chip 1703 are wire bonded to the wiring pattern 1722 using bonding wires 1704. The upper surface of the organic material substrate 1721 is sealed with a mold resin 1706; and solder balls 1725 are mounted on the ball mounting pads 1724.

The die pad 1701 is extended outwardly to form ground bonding areas 1714 at the every square sides. The structure further includes power supply bonding areas 1717 at the every square sides of the die pad 1701. Each of the power supply bonding areas 1717 is formed to be an integral body with the wiring pattern 1722p for power supply terminals P. The power supply bonding areas 1717 are arranged to surround the die pad 1701.

The organic material substrate 1721 is provided with four cavities or grooves 1727 each of which is formed between one ground bonding area 1714 and the opposite or facing power supply bonding areas 1717. In other words, the cavities 1727 are extended along the sides of the die pad 1701. The cavities 1727 are formed by a milling process. Each of the cavities 1727 is provided at the bottom with a chip capacitor mounting pad 1711, and at a sidewall with a plating. Chip capacitors 1710 are mounted on the chip capacitor mounting pads 1711 in the cavities 1727 with a conductive adhesive 1712, such as silver-epoxy system adhesives or solder paste.

The die pad 1701 is provided at the surface with projection or ridge 1728, which extends along the every side of the die pad 1701. The projection 1728 defines a chip mounting area 1720 and the ground bonding areas 1714 so that the conductive paste 1702 is prevented from being leaked out toward the bonding areas 1714. The projection 1728 is of a solder resist (1726) and is shaped to have a height of 0.05 to 0.2 mm.

As shown in FIG. 37A, surface electrodes for power supply on the semiconductor chip 1703 are connected to power-supply terminals (1722*p*) with the bonding wires 1704. On the other hand, as shown in FIG. 37B, surface electrodes for ground on the semiconductor chip 1703 are connected to the ground bonding areas 1714. The ground bonding areas 1714 are connected to the wiring pattern 1722*g* for the ground terminals "G" with the bonding wires 1704.

The capacity of each of the chip capacitors 1710 is about 0.1 to 1.0 micro F ($\mu$F). Preferably, the number of chip capacitors 1710 or total amount of capacity becomes equivalent for each side of the die pad 1701. In FIG. 36, the number of chip capacitors 1710 is five for each side of the die pad 1701.

As described above, according to the seventeenth preferred embodiment of the present invention, decoupling capacitors 1710 can be arranged close to the semiconductor chip 1703. In other words, the distance between the decoupling capacitors 1710 and semiconductor chip 1703 is shortened as compared to the conventional apparatus. As a result, a parasitic inductance is decreased; and therefore, power supply/ground noise is effectively decreased.

Further, the ground bonding areas 1714 are formed, so that a large number of ground wiring lines can be provided. Furthermore, according to the seventeenth preferred embodiment, the chip capacitors 1710 are mounted in the cavities 1727, therefore, it can be prevented that a short circuit is generated between the chip capacitors 1710 and bonding wires 1704.

Eighteenth Preferred Embodiment

Figure 38:
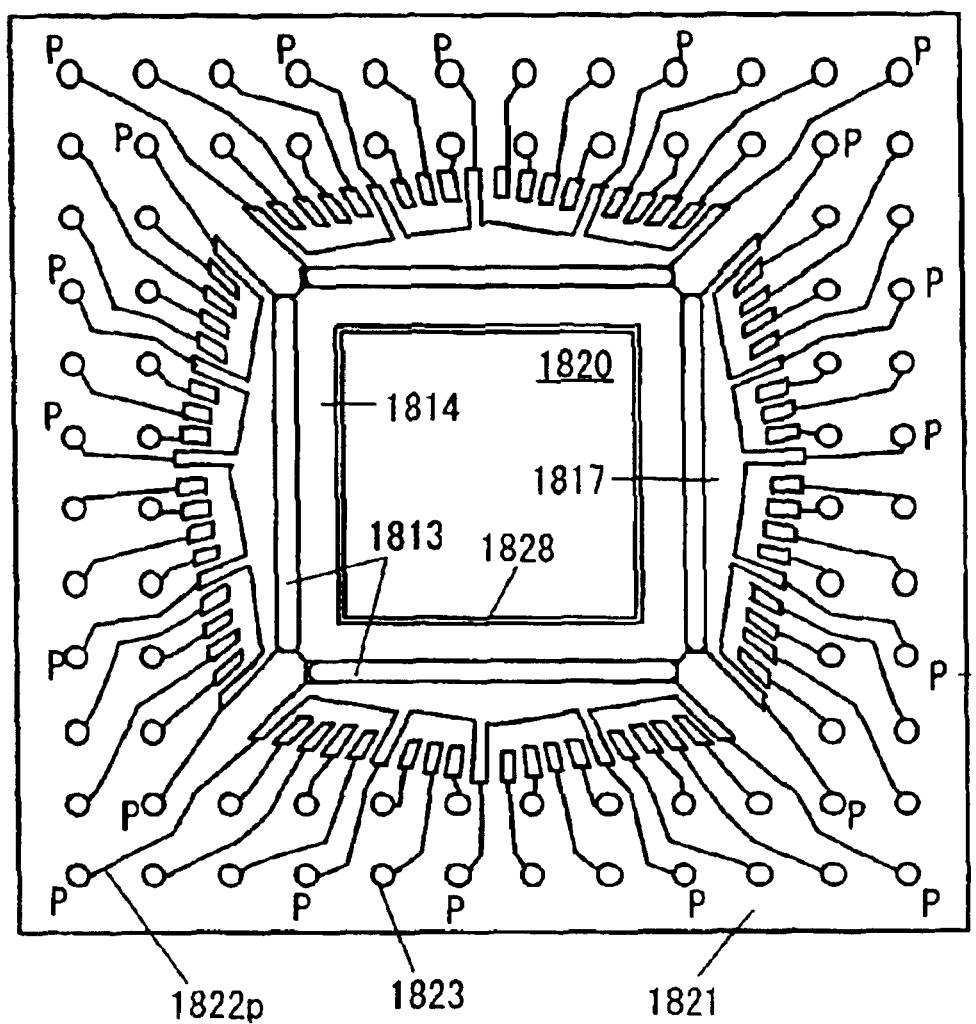
FIG. 38 is a plane view showing an inside of a BGA (Ball Grid Array) type of semiconductor package according to an eighteenth preferred embodiment of the present invention.
Figure 39A:
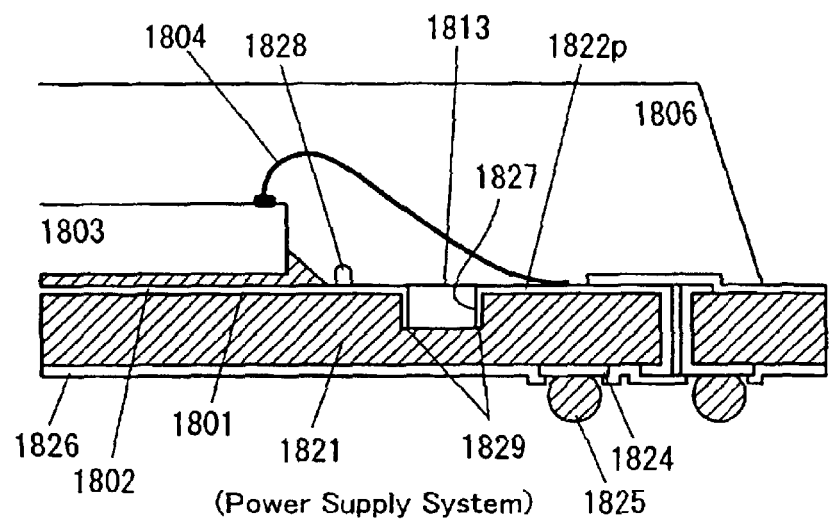
FIG. 39A is a cross-sectional view showing a part of an inside of the semiconductor package, shown in FIG. 38.
Figure 39B:
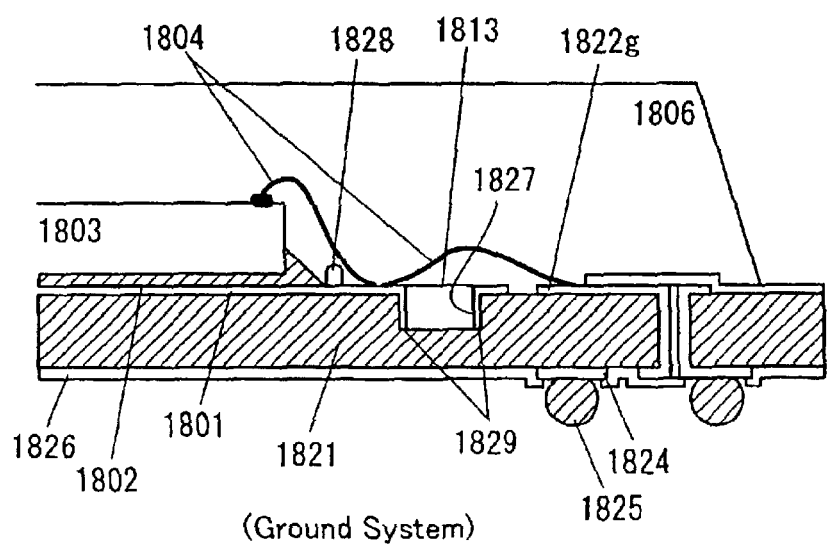
FIG. 39B is a cross-sectional view showing a part of an inside of the semiconductor package, shown in FIG. 38.

FIG. 38 is a plane view showing an inside of a BGA (Ball Grid Array) type of semiconductor package according to an eighteenth preferred embodiment of the present invention. FIGS. 39A and 39B are cross-sectional views showing a part of an inside of the semiconductor package, shown in FIG. 38. This embodiment is formed by applying the above described eighth preferred embodiment to a BGA type of semiconductor package. In the drawings, "P" represents power supply terminals, and "G" represents ground terminals. This embodiment is applicable to a PGA (Pin Grid Array) type of semiconductor apparatus.

According to this embodiment, a copper layer is formed on a surface of an organic material substrate 1821, and the copper layer is etched to form a conductive pattern (wiring pattern) 1822. The wiring pattern 1822 (1822*p*, 1822*g*) is connected via through holes 1823 to ball mounting pads 1824, formed on the opposite surface of the organic material substrate 1821. A solder resist 1826 is selectively formed on the both surface of the organic material substrate 1821.

A semiconductor chip 1803 is mounted on a die pad 1801, formed on the organic material substrate 1821, with a conductive paste 1802. Surface electrodes of the semiconductor chip 1803 are wire bonded to the wiring pattern 1822 (1822*p*, 1822*g*) using bonding wires 1804. The upper surface of the organic material substrate 1821 is sealed with a mold resin 1806; and solder balls 1825 are mounted on the ball mounting pads 1824.

The die pad 1801 is extended outwardly to form ground bonding areas 1814 at the every square sides. The structure further includes power supply bonding areas 1817 at the every square sides of the die pad 1801. Each of the power supply bonding areas 1817 is formed to be an integral body with the wiring pattern 1822*p* for power supply terminals P. The power supply bonding areas 1817 are arranged to surround the die pad 1801.

The organic material substrate 1821 is provided with four cavities or grooves 1827 each of which is formed between one ground bonding area 1814 and the opposite or facing power supply bonding areas 1817. In other words, the cavities 1827 are extended along the sides of the die pad 1801. The cavities 1827 are formed by a milling process. Each of the cavities 1827 is provided at an inner wall with an electrode 1829 by a sidewall plating process so that the electrodes 1829 are connected to the power supply bonding areas 1817 and die pad 1801. The cavities 1827 are filled up with high dielectric constant material 1813 to form decoupling capacitors. The high dielectric constant material 1813 may be ceramics, such as alumina (aluminum oxide) and titan oxide.

The die pad 1801 is provided at the surface with projection or ridge 1828, which extends along the every side of the die pad 1801. The projection 1828 defines a chip mounting area 1820 and the ground bonding areas 1814 so that the conductive paste 1802 is prevented from being leaked out toward the bonding areas 1814. The projection 1828 is of a solder resist (1826) and is shaped to have a height of 0.05 to 0.2 mm.

As shown in FIG. 39A, surface electrodes for power supply on the semiconductor chip 1803 are connected to power-supply terminals (1822*p*) with the bonding wires 1804. On the other hand, as shown in FIG. 39B, surface electrodes for ground on the semiconductor chip 1803 are connected to the ground bonding areas 1814. The ground bonding areas 1814 are connected to the wiring pattern 1822*g* for the ground terminals "G" with the bonding wires 1804. The capacity of each of the chip capacitors 1710 is about 0.1 to 1.0 micro F ($\mu$F).

As described above, according to the eighteenth preferred embodiment of the present invention, a decoupling capacitor (1813) can be arranged close to the semiconductor chip 1803. In other words, the distance between the decoupling capacitor and semiconductor chip 1803 is shortened as compared to the conventional apparatus. As a result, a parasitic inductance is decreased; and therefore, power supply/ground noise is effectively decreased.

Furthermore, the package includes the bonding areas 1814 and 1817 at every side of the die pad 1801, so that a large number of conductive lines, extending from the semiconductor chip 1803, can be formed and connected to the ground and power supply terminals (G and P). In addition, the decoupling capacitors (1813) can be formed before the semiconductor chip 1803 is mounted; and therefore, the fabricating process of the semiconductor package becomes simple as compared with the case of using chip capacitors.

Nineteenth Preferred Embodiment

Figure 40:
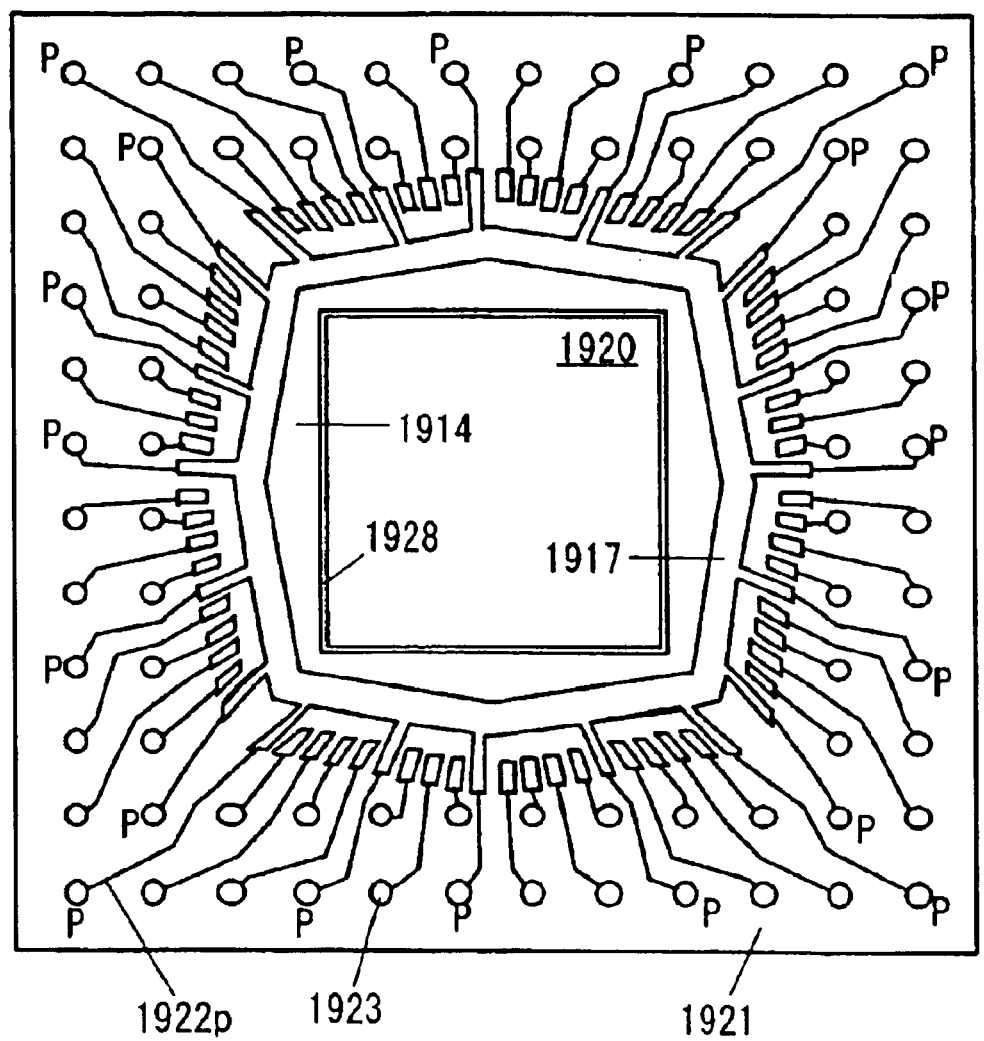
FIG. 40 is a plane view showing an inside of a BGA (Ball Grid Array) type of semiconductor package according to a nineteenth preferred embodiment of the present invention.
Figure 41A:
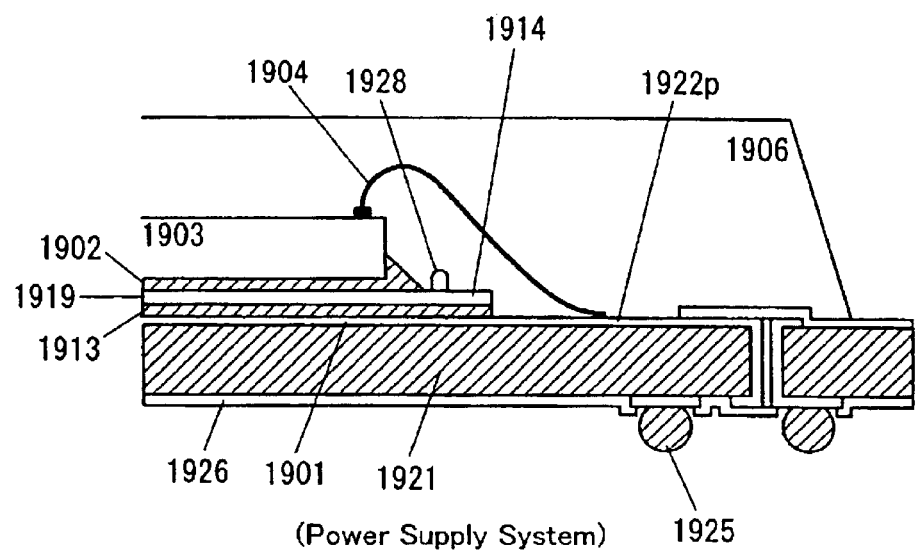
FIG. 41A is a cross-sectional view showing a part of an inside of the semiconductor package, shown in FIG. 40.
Figure 41B:
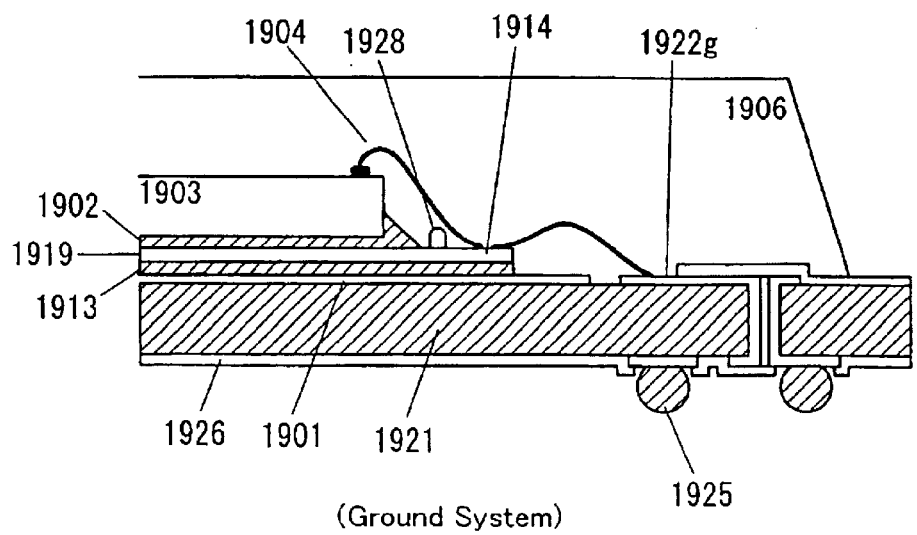
FIG. 41B is a cross-sectional view showing a part of an inside of the semiconductor package, shown in FIG. 40.

FIG. 40 is a plane view showing an inside of a BGA (Ball Grid Array) type of semiconductor package according to a nineteenth preferred embodiment of the present invention. FIGS. 41A and 41B are cross-sectional views showing a part of an inside of the semiconductor package, shown in FIG. 40. This embodiment is formed by applying the above described ninth preferred embodiment to a BGA type of semiconductor package. In the drawings, "P" represents power supply terminals, and "G" represents ground terminals. This embodiment is applicable to a PGA (Pin Grid Array) type of semiconductor apparatus.

According to this embodiment, a copper layer is formed on a surface of an organic material substrate 1921, and the copper layer is etched to form a conductive pattern (wiring pattern) 1922. The wiring pattern 1922 (1922$p$, 1922$g$) is connected via through holes 1923 to ball mounting pads 1924, formed on the opposite surface of the organic material substrate 1921. A solder resist 1926 is selectively formed on the both surface of the organic material substrate 1921.

A semiconductor chip 1903 is mounted on a die pad 1901, formed on the organic material substrate 1921, with a conductive paste 1902. Surface electrodes of the semiconductor chip 1903 are wire bonded to the wiring pattern 1922 (1922$p$, 1922$g$) using bonding wires 1904. The upper surface of the organic material substrate 1921 is sealed with a mold resin 1906; and solder balls 1925 are mounted on the ball mounting pads 1924.

The die pad 1901 is expanded at every side to form bonding area 1917 for power supply. The semiconductor package further includes a plate 1913 of high dielectric constant material provided on the die pad 1901. On the plate 1913, a metal plate 1919 is formed. The high dielectric constant material 1913 may be ceramics, such as alumina (aluminum oxide) and titan oxide. The plate 1913 may be adhered between the die pad 1901 and metal plate 1919. The metal plate 1919 is shaped to be slightly (0.5 to 1.0 mm) small in area than the die pad 1901.

The metal plate 1919 is provided with a projection or ridge 1928 surrounding a chip mounting area 1920 to have a height of about 0.05 to 0.2 mm to divide the chip mounting area 1920 from the bonding area 1914. The projection 1928 is designed to prevent the conductive paste 1902 from being leaked out toward the bonding area 1914. The die pad 1901 is further provided with a bonding area 1917 for power supply which is formed to be united or integrated with power supply terminals (P). The power supply bonding area 1917 is formed based on the size difference between the die pad 1901 and metal plate 1919. In other words, the power supply bonding area 1917 is a part of the die pad 1901 that is not covered with the metal plate 1919.

As shown in FIG. 41A, surface electrodes for power supply of the semiconductor chip 1903 are connected to the supply bonding area 1917, united with the wiring pattern 1922$p$ for power supply, using the bonding wires 1904. As shown in FIG. 41B, surface electrodes for ground of the semiconductor chip 1903 are connected through the ground bonding area 1914 to the wiring pattern 1922$g$ for ground using the bonding wires 1904.

In fabrication, the semiconductor chip 1903 is mounted on the chip mounting area 1920 of the metal plate 1919 with the conductive paste 1902. After that, surface electrodes for power supply of the semiconductor chip 1903 are connected through the supply bonding area 1917 to the power supply terminal (P) using bonding wires 1904, as shown in FIG. 41A. The surface electrodes for ground of the semiconductor chip 1903 are connected through the ground bonding area 1914 to the ground terminals (G) using the bonding wires 1904.

As described above, according to the nineteenth preferred embodiment of the present invention, a decoupling capacitor (1913) can be arranged at the closest position to the semiconductor chip 1903. In other words, the distance between the decoupling capacitor (1913) and semiconductor chip 1903 is remarkably shortened as compared to the conventional apparatus. As a result, a parasitic inductance is decreased; and therefore, power supply/ground noise is effectively decreased.

Furthermore, the package includes the bonding areas 1914 and 1917 at every side of the die pad 1901, so that a large number of conductive lines, extending from the semiconductor chip 1903, can be formed and connected to the ground and power supply terminals (G and P). In addition, a large capacity of decoupling capacitor can be formed by controlling the thickness of the high dielectric constant material 913 and/or the dielectric constant value of the plate 1913.

What is claimed is:

1. A semiconductor apparatus comprising:

an organic material substrate;

a die pad formed on the organic material substrate, a semiconductor chip being mounted on the die pad;

ground terminals which are to be grounded;

power supply terminals which are supplied with electrical power;

first conductive patterns which are formed on the organic material substrate and are connected to the ground terminals;

second conductive patterns which are formed on the organic material substrate and are connected to the power supply terminals, in which adjacent two of the first and second conducive patterns are extended inwardly;

chip capacitor mounting pads which are provided at inner ends of the extended first and second conductive patterns; and chip capacitors which are mounted on the chip capacitor mounting pads so that a decoupling capacitor is provided.

2. A semiconductor apparatus according to claim 1, wherein the chip capacitor mounting pad are adhered to the first and second conductive patterns with a conductive adhesive.

3. A semiconductor apparatus according to claim 1, wherein the number of chip capacitors or total amount of capacity of the chip capacitors becomes equivalent for every side of the die pad.

4. A semiconductor apparatus according to claim 1, wherein the organic material substrate is provided with cavities in which the chip capacitors are mounted therein.

5. A semiconductor apparatus according to claim 4, wherein the chip capacitor mounting pads are arranged at bottoms of the cavities, each of which is provided with side wall plating electrically connected to the corresponding first and second conductive patterns.

* * * * *